US009165780B2

(12) United States Patent
Shimizu et al.

(10) Patent No.: US 9,165,780 B2
(45) Date of Patent: Oct. 20, 2015

(54) PLASMA PROCESSING APPARATUS AND PLASMA PROCESSING METHOD

(71) Applicant: TOKYO ELECTRON LIMITED, Tokyo (JP)

(72) Inventors: Akira Shimizu, Yamanashi (JP); Yu Wamura, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 98 days.

(21) Appl. No.: 14/031,411

(22) Filed: Sep. 19, 2013

(65) Prior Publication Data

US 2014/0087564 A1     Mar. 27, 2014

(30) Foreign Application Priority Data

Sep. 21, 2012   (JP) ................................. 2012-208434
Jun. 14, 2013   (JP) ................................. 2013-125684

(51) Int. Cl.

| H01L 21/3065 | (2006.01) |
|---|---|
| C23C 16/455 | (2006.01) |
| C23C 16/509 | (2006.01) |
| H01L 21/02 | (2006.01) |
| H01J 37/32 | (2006.01) |
| H01L 21/311 | (2006.01) |

(52) U.S. Cl.
CPC ...... *H01L 21/3065* (2013.01); *C23C 16/45536* (2013.01); *C23C 16/509* (2013.01); *H01J 37/32091* (2013.01); *H01J 37/32174* (2013.01); *H01J 37/32669* (2013.01); *H01L 21/0217* (2013.01); *H01L 21/0228* (2013.01); *H01L 21/02164* (2013.01); *H01L 21/02274* (2013.01); *H01L 21/31111* (2013.01)

(58) Field of Classification Search
None
See application file for complete search history.

(56) References Cited

U.S. PATENT DOCUMENTS

2004/0182516 A1*   9/2004   Lindley et al. ........... 156/345.46
2009/0029562 A1*   1/2009   Okada et al. .................. 438/763

FOREIGN PATENT DOCUMENTS

| JP | 7-288195 A | 10/1995 |
|---|---|---|
| JP | 2001-118793 A | 4/2001 |
| JP | 2005-56936 A | 3/2005 |
| JP | 2007-281414 A | 10/2007 |
| JP | 2009-506204 A | 2/2009 |

* cited by examiner

*Primary Examiner* — Joseph Miller, Jr.
(74) *Attorney, Agent, or Firm* — Nath, Goldberg & Meyer; Jerald L. Meyer

(57) ABSTRACT

Provided is a plasma processing apparatus, which includes a table unit installed within a processing vessel and configured to receive a substrate thereon, a gas supply unit configured to supply a process gas into the processing vessel, a plasma generating unit configured to turn the process gas to plasma, a magnetic field forming mechanism installed at a lateral side of the table unit and configured to form magnetic fields in a processing atmosphere in order to move electrons existing in the plasma of the process gas along a surface of the substrate; and an exhaust mechanism configured to exhaust gas from the interior of the processing vessel. The magnetic fields are opened at at-least one point in a peripheral edge portion of the substrate such that a loop of magnetic flux lines surrounding the peripheral edge portion of the substrate is not formed.

6 Claims, 40 Drawing Sheets

PLASMA PROCESSING APPARATUS AND PLASMA PROCESSING METHOD

CROSS-REFERENCE TO RELATED APPLICATIONS

This application claims the benefit of Japanese Patent Application Nos. 2012-208434, filed on Sep. 21, 2012; and 2013-125684, filed on Jun. 14, 2013, in the Japan Patent Office, the disclosure of which are incorporated herein in their entirety by reference.

TECHNICAL FIELD

The present disclosure relates to a plasma processing apparatus and plasma processing method, which perform a plasma processing on a substrate using plasma obtained by turning a process gas to plasma.

BACKGROUND

From among methods of forming a thin film, e.g., a silicon oxide ($SiO_2$) film or a silicon nitride ($Si_3N_4$) film, on a semiconductor wafer (hereinafter referred to as a "wafer"), there is known a method that makes use of plasma obtained by converting a process gas, such as a silicon-containing raw material gas or a reaction gas (an oxidizing gas or a nitriding gas) reacting with the raw material gas, to form plasma. Examples of film formation methods include CVD (Chemical Vapor Deposition) and ALD (Atomic Layer Deposition). In case of the CVD method, a raw material gas and a reaction gas are converted to plasma and caused to react with each other in a vapor phase. A reaction product generated by the reaction is deposited on a wafer. On the other hand, in the ALD method, plasma obtained by the raw material gas and plasma obtained by the reaction gas are alternately supplied to the wafer, thereby alternately performing an adsorption of a silicon component onto a surface of the wafer and a reaction of the silicon component on the surface of the wafer.

As an example of a film formation apparatus for use in the film formation method, there is available an apparatus in which a table unit for placing, e.g., a wafer, thereon is installed as a lower electrode within a processing vessel and in which a gas shower head used as an upper electrode is disposed to face the table unit. Plasma of a process gas is obtained by supplying a process gas into the processing vessel and applying a high-frequency power having a frequency of, e.g., 13.56 MHz, to one of the table unit and the gas shower head.

In case where a recess such as a hole or a groove is formed on the surface of the wafer, if the recess has an aspect ratio of several tens or several hundreds, it becomes difficult to satisfactorily form a film on inner wall surfaces of the recess. In other words, thin films formed on the inner wall surfaces of the recess become smaller in thickness or poorer in quality than thin films formed on a horizontal surface of the wafer (a bottom surface of the recess and the upper surface of the wafer). There is available a conventional apparatus in which a dipole ring magnet is disposed outside a processing chamber. However, the conventional apparatus is outdated in terms of the aforementioned problems.

SUMMARY

Some embodiments of the present disclosure provide a plasma processing apparatus and a plasma processing method, which are capable of, when a substrate having a recess formed thereon is subjected to plasma processing by plasma, performing the plasma processing on inner wall surfaces of the recess in a manner similar to processing on a horizontal surface of the substrate.

According to one embodiment of the present disclosure, provided is a plasma processing apparatus, which includes: a table unit installed within a processing vessel and configured to receive a substrate thereon; a gas supply unit configured to supply a process gas into the processing vessel; a plasma generating unit configured to turn the process gas to plasma; a magnetic field forming mechanism installed at a lateral side of the table unit and configured to form magnetic fields in a processing atmosphere in order to move electrons existing in the plasma of the process gas along a surface of the substrate; and an exhaust mechanism configured to exhaust gas from the interior of the processing vessel, wherein the magnetic fields are opened at at-least one point in a peripheral edge portion of the substrate such that a loop of magnetic flux lines surrounding the peripheral edge portion of the substrate is not formed.

According to another embodiment of the present disclosure, provided is a plasma processing method, which includes: placing a substrate on a table unit installed within a processing vessel; exhausting gas from the interior of the processing vessel; supplying a process gas into the processing vessel; turning the process gas to plasma and supplying the plasma to the substrate; and forming magnetic fields in a processing atmosphere, the magnetic fields opened at at-least one point in a peripheral edge portion of the substrate such that a loop of magnetic flux lines surrounding the peripheral edge portion of the substrate is not formed, and moving electrons existing in the plasma of the process gas in a first direction extending along a surface of the substrate.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<First Embodiment: Single-Substrate Type Plasma Processing Apparatus>

Figure 1:
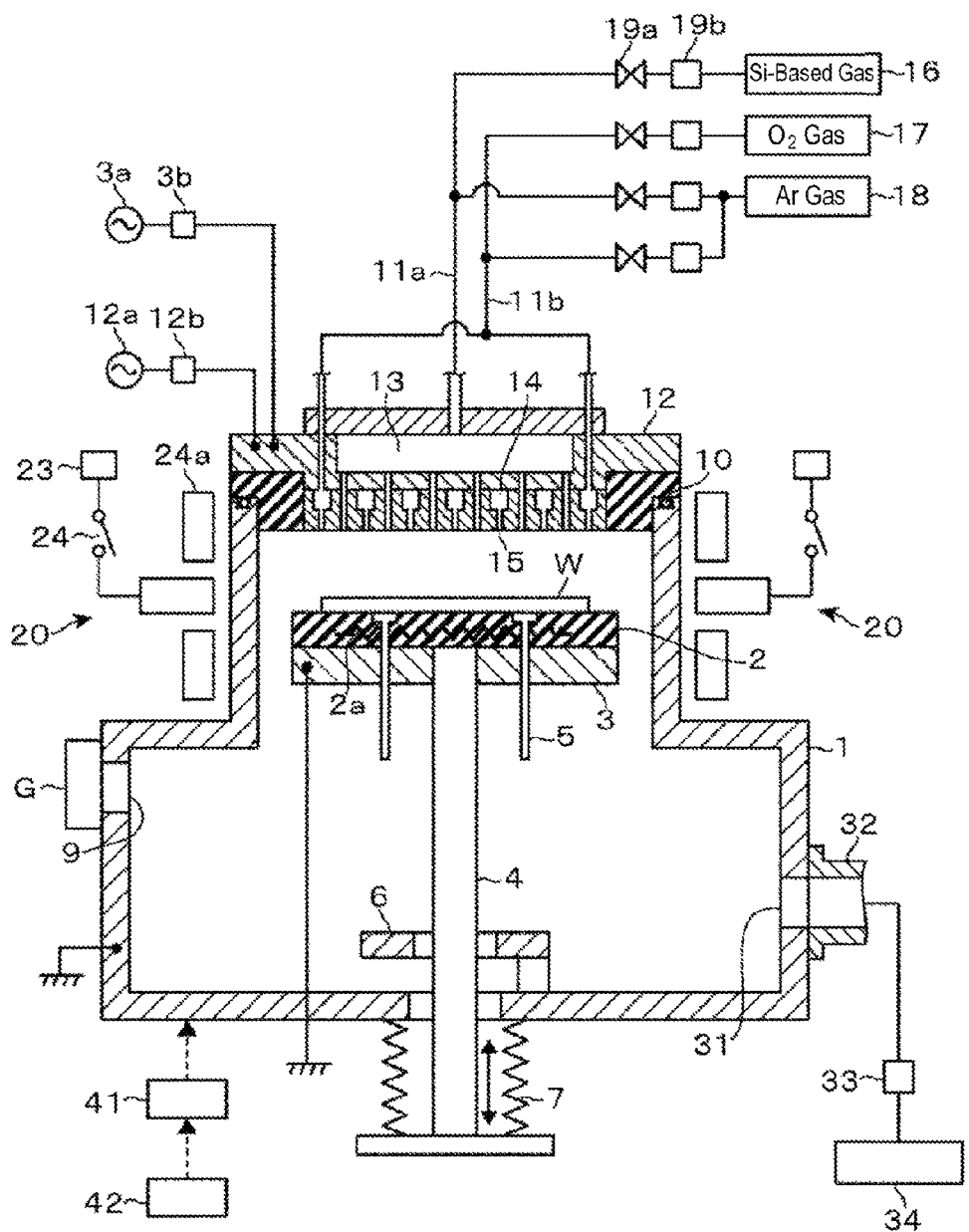
FIG. 1 is a vertical sectional view showing an example of a plasma processing apparatus according to a first embodiment of the present disclosure.
Figure 2:
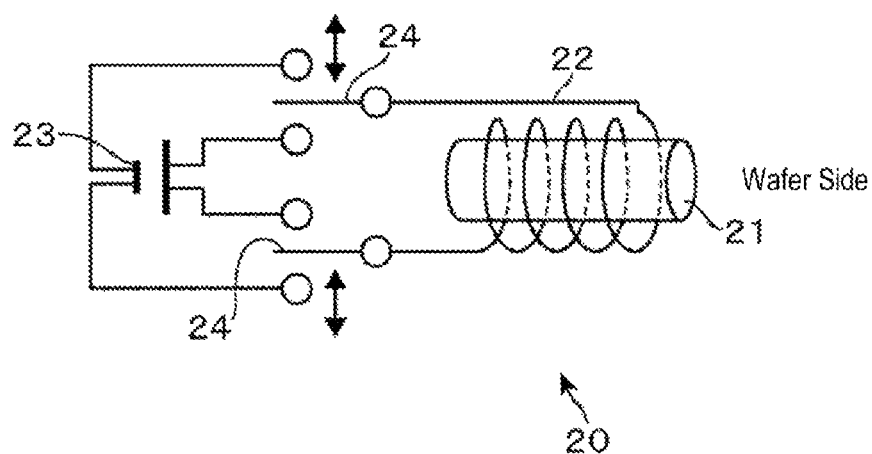
FIG. 2 is a schematic view showing a magnetic field forming mechanism employed in the plasma processing apparatus of FIG. 1.

One example of a single-substrate type plasma processing apparatus according to a first embodiment of the present disclosure will be described with reference to FIGS. 1 through 3. First, a brief description will be made on an outline of the plasma processing apparatus. The plasma processing apparatus is constituted as a film formation apparatus which forms a thin film using an ALD (Atomic layer Deposition) method by which a reaction product is deposited by sequentially (or alternately) supplying plasma of plural kinds (two kinds, in this embodiment) from mutually reacting process gases to a wafer W. Even for the wafer W with a recess having an aspect ratio of several tens or several hundred formed therein, the film formation apparatus can form a thin film on inner wall surfaces of the recess with the same thickness and quality as those of a horizontal surface of the wafer W. Description will now be made on a configuration of the film formation apparatus and a film formation method using the same.

The film formation apparatus includes a substantially cylindrical processing vessel 1 made of a magnetic permeable material (a material permitting magnetic fluxes to pass therethrough), and a table unit 2 which is disposed within the processing vessel 1 and is configured to receive the wafer W having a diameter of, e.g., 300 mm, thereon. The processing vessel 1 is formed such that, when viewed from the top, the diameter of an upper portion thereof becomes smaller than that of a lower portion. Magnetic field forming mechanisms 20 (which will be described later) are disposed outside the upper portion of the processing vessel 1 to cause electrons existing in the plasma to horizontally move along the surface of the wafer W within the processing vessel 1. In FIG. 1, a reference number 9 designates a transfer port through which the wafer W is loaded into and unloaded from the processing vessel 1 and a reference symbol G designates a gate valve.

A heater 2a is installed in the table unit 2. The heater 2a is configured to heat the wafer W placed on the table unit 2 to a predetermined film formation temperature, e.g., 300 degrees C., based on an electric power supplied from a power supply (not shown). A lower electrode 3 formed of a conductive material is disposed on a lower surface of the table unit 2. The lower electrode 3 is tied to ground.

An elevating shaft 4 configured to vertically move the lower electrode 3 upward and downward is connected to the center of a lower surface of the lower electrode 3 such that both the table unit 2 and the lower electrode 3 are vertically moved between an upper position where a film formation processing is performed on the wafer W and a lower position where the wafer W is loaded into and unloaded from the table unit 2. For example, three elevating pins 5 are disposed such that they penetrate vertically through the table unit 2 and the lower electrode 3 and lower ends of the elevating pins 5 are supported by the table unit 2. When the table unit 2 is moved down to the lower position, the downward movement of the elevating pins 5 is restrained by a ring member 6 which is disposed on a bottom surface of the processing vessel 1 and is configured to surround the elevating shaft 4. At this time, the wafer W is moved upward away from the table unit 2 by the elevating pins 5. In FIG. 1, a reference number 7 designates a bellows installed around the elevating shaft 4 to keep the processing vessel 1 air-tight.

In this embodiment, each of the magnetic field forming mechanisms 20 is made of an electromagnet. Specifically, as shown in FIG. 2, each of the magnetic field forming mechanisms 20 includes a substantially rod-shaped core member 21 made of a magnetic material (e.g., iron) and a conductive wire 22 wound around the core member 21 in a coil shape to extend from one end to the other end of the core member 21 along a longitudinal direction of the core member 21. A DC (direct current) power supply 23 is connected to the conductive wire 22 through switches 24. The magnetic field forming mechanisms 20 are configured to change over a magnetic pole (South ("S") pole or North ("N") pole) at one end and the other end of the core member 21 by operating the switches 24.

That is, the switches 24 are installed as magnetic field switching mechanisms at one end and the other end of the conductive wire 22. The switches 24 are respectively connected to a positive terminal and a negative terminal of the DC power supply 23. In this configuration, when the one end and the other end of the conductive wire 22 are respectively connected to the positive terminal and the negative terminal of the DC power supply 23, primary directional magnetic fields are formed within the processing vessel 1. Conversely, when the one end and the other end of the conductive wire 22 are respectively connected to the negative terminal and the positive terminal of the DC power supply 23, secondary directional magnetic fields opposite to the primary directional magnetic fields are formed within the processing vessel 1. In reality, as shown in FIGS. 4 through 7, the magnetic fields (magnetic flux lines) are formed in various patterns depending on orientations of the magnetic poles of the magnetic field forming mechanisms 20, but for the sake of simplicity, simplified magnetic fields are described.

In order to form horizontally-extending magnetic flux lines within the processing vessel 1, the magnetic field forming mechanisms 20 are disposed such that the core member 21 extends along the horizontal direction and the one end of the core member 21 in a longitudinal direction faces the processing vessel 1. With this configuration, the magnetic field forming mechanisms 20 can change over the directions of the magnetic flux lines formed within the processing vessel 1, between a forward direction in which the magnetic flux lines extend from one side toward the other side along the horizontal direction and a backward direction in which the magnetic flux lines extend from the other side toward the one side. A surface of the conductive wire 22 is coated with, e.g., a resin, in order to insulate the conductive wire 22 from the core member 21.

Vertical positions of the magnetic field forming mechanisms 20 are set to ensure that the magnetic flux lines are formed inside the recess formed in the surface of the wafer W. In other words, the magnetic field forming mechanisms 20 are disposed alongside the table unit 2 at the upper position. Specifically, in this embodiment, the magnetic field forming mechanisms 20 are disposed to straddle over a region between a vertical position of a front surface of the wafer W placed on the table unit 2 in the upper position, and a vertical position of a lower surface of the wafer W.

Figure 3:
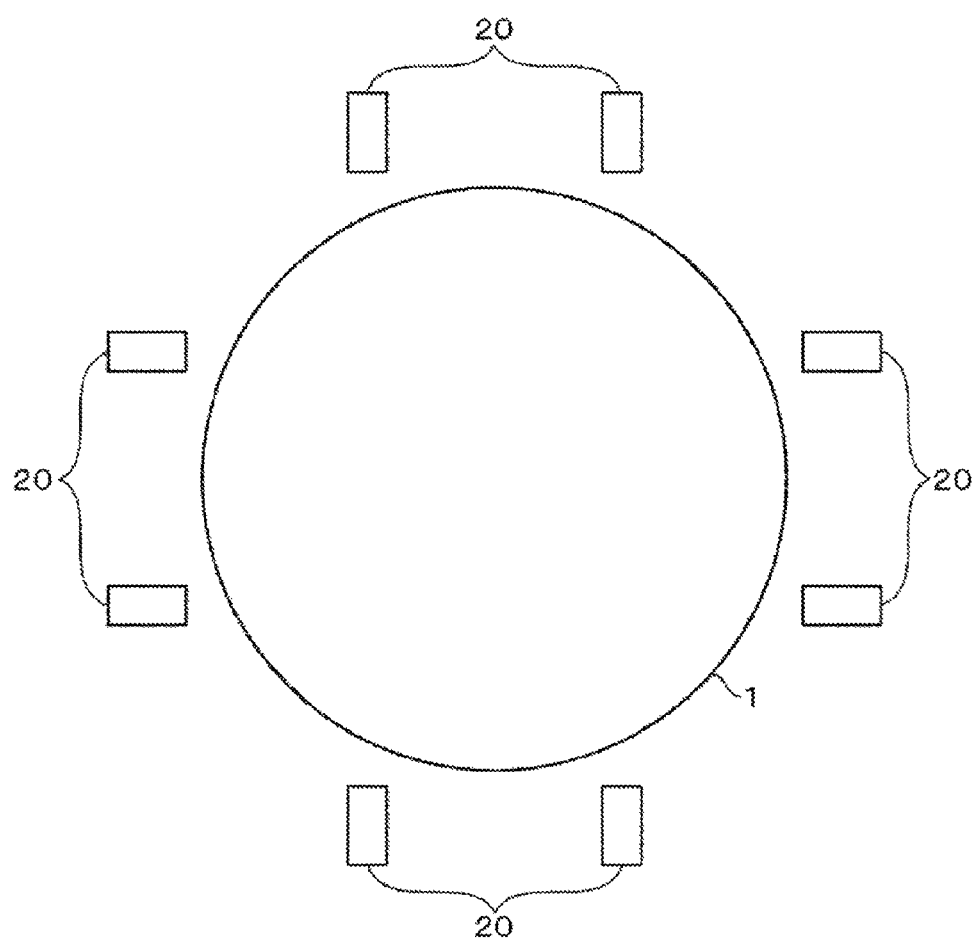
FIG. 3 is a plane view schematically showing an arrangement layout of magnetic field forming mechanisms employed in the plasma processing apparatus of FIG. 1.

As shown in FIG. 3, the magnetic field forming mechanisms 20 are disposed at a plurality of (e.g., eight) locations in a circumferential direction of the processing vessel 1. Specifically, assuming that one side in the horizontal direction is referred to as a front side and if the other side opposite to the one side is referred to as a rear side, two magnetic field forming mechanisms 20 are disposed at the front side of the processing vessel 1 in a mutually spaced-apart relationship. At the rear side of the processing vessel 1, two magnetic field forming mechanisms 20 are disposed so as to face the two magnetic field forming mechanisms 20 disposed at the front side, respectively. At one side (right side) and the other side (left side) of a horizontal line orthogonal to a line interconnecting the front side and the rear side, there are installed two magnetic field forming mechanisms 20 in a mutually spaced-apart relationship. In FIG. 1, reference number 24a respectively designate magnetic flux line confining members made of, e.g., a permanent magnet and are disposed at upper and lower sides of each of the magnetic field forming mechanisms 20. The magnetic flux line confining members 24a are disposed to restrain the magnetic flux lines formed by the magnetic field forming mechanisms 20 from being diffused outward of the processing vessel 1.

Accordingly, if the respective magnetic poles of the eight magnetic field forming mechanisms 20 are set independently of one another, different kinds of magnetic flux lines are formed within the processing vessel 1. FIGS. 4 through 7 show simulation results of the magnetic flux lines formed within the processing vessel 1 when the respective magnetic poles of the eight magnetic field forming mechanisms 20 are set independently of one another. In this regard, assuming that the right one of the two magnetic field forming mechanisms 20 disposed at the rear side of the processing vessel 1 is referred to as a first magnetic field forming mechanism 20, and the remaining magnetic field forming mechanisms 20 are referred to as second, third, . . . , and eighth magnetic field forming mechanism 20 in that order clockwise from the first magnetic field forming mechanism 20. Sample orientations of the magnetic pole directions of the respective magnetic field forming mechanisms 20 shown in FIGS. 4 through 7 (the magnetic poles existing near the processing vessel 1) are shown in Table 1 below. In Table 1, the magnetic field forming mechanisms 20 are abbreviated as "magnets."

TABLE 1

Figure 4:
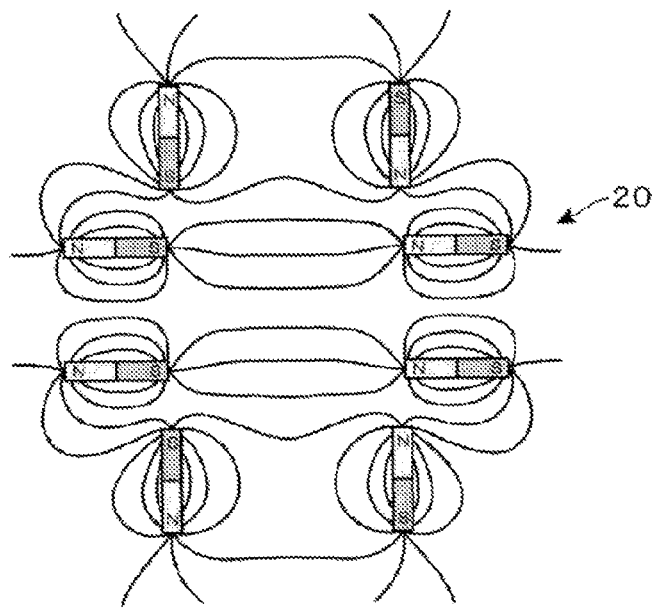
FIG. 4 is a first plane view showing magnetic flux lines formed by the magnetic field forming mechanisms.
Figure 5:
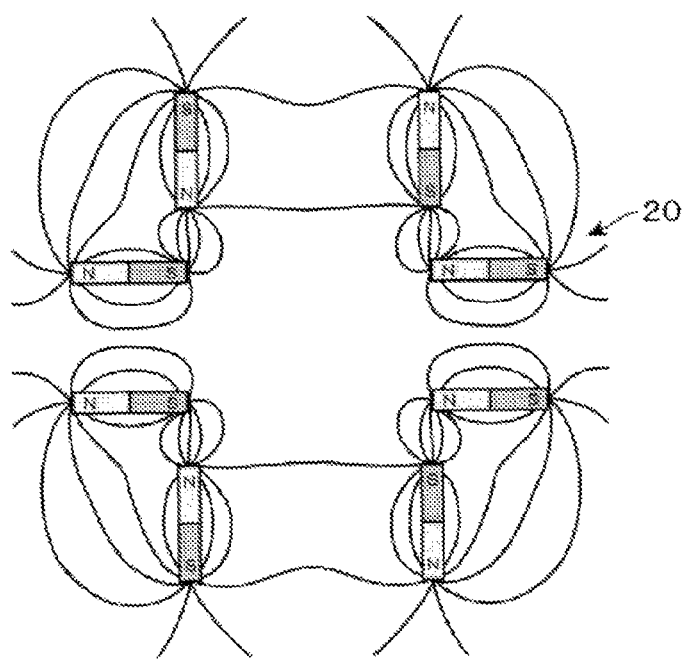
FIG. 5 is a second plane view showing magnetic flux lines formed by the magnetic field forming mechanisms.
Figure 6:
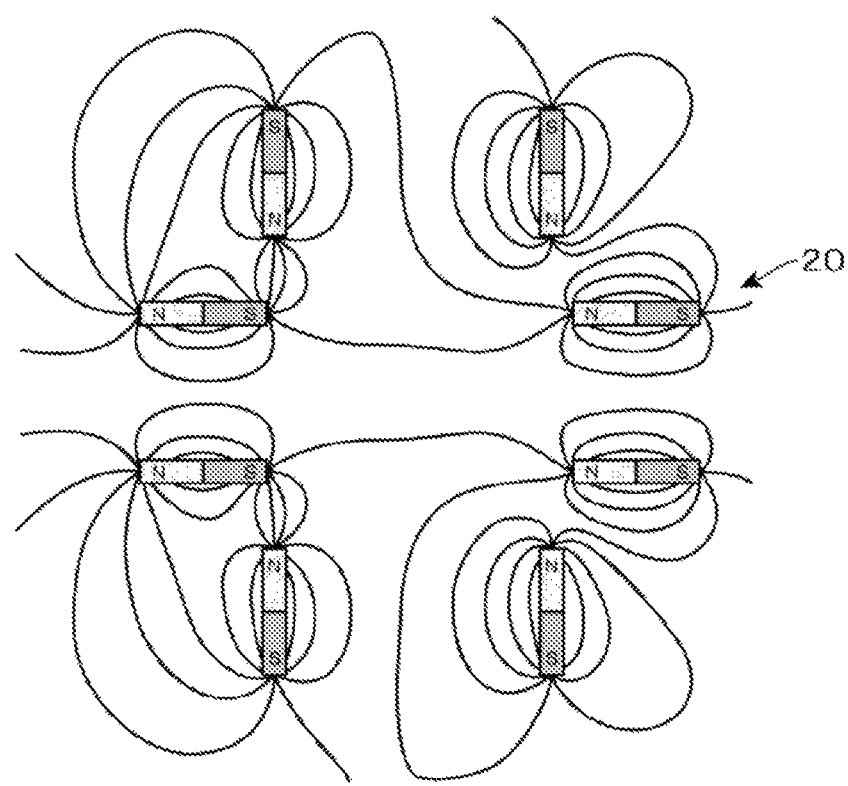
FIG. 6 is a third plane view showing magnetic flux lines formed by the magnetic field forming mechanisms.
Figure 7:
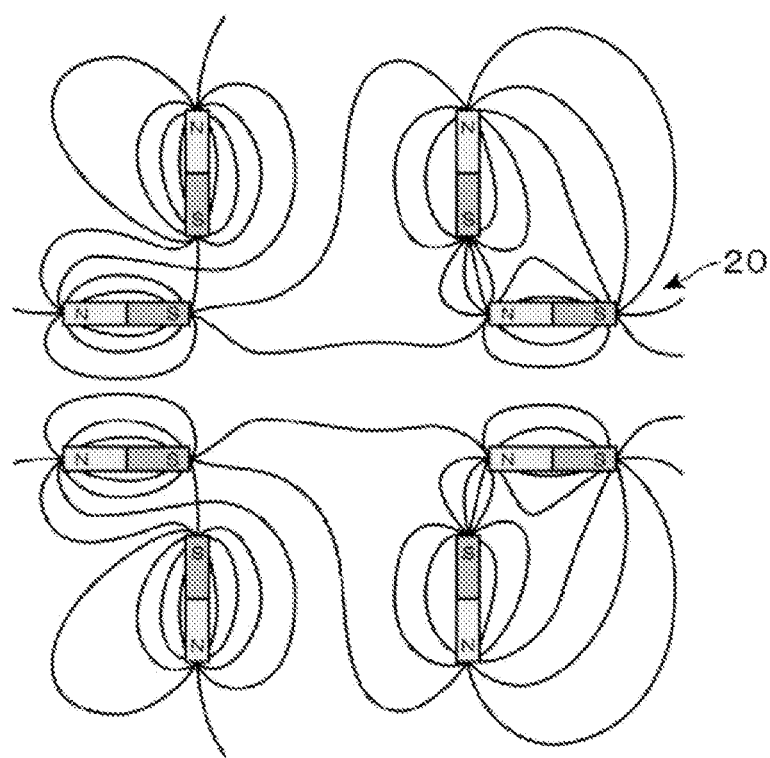
FIG. 7 is a fourth plane view showing magnetic flux lines formed by the magnetic field forming mechanisms.

|  | FIG. 4 | FIG. 5 | FIG. 6 | FIG. 7 |
| --- | --- | --- | --- | --- |
| First Magnet | N pole | S pole | N pole | S pole |
| Second Magnet | N pole | N pole | N pole | N pole |
| Third Magnet | N pole | N pole | N pole | N pole |
| Fourth Magnet | N pole | S pole | N pole | S pole |
| Fifth Magnet | S pole | N pole | N pole | S pole |
| Sixth Magnet | S pole | S pole | S pole | S pole |
| Seventh Magnet | S pole | S pole | S pole | S pole |
| Eighth Magnet | S pole | N pole | N pole | S pole |

As can be appreciated in FIGS. 4 through 7, loops of the magnetic flux lines within the processing vessel 1 are not closed in any one of the above examples. Accordingly, in each example of Table 1, the plasma is not confined even if the magnetic fields are formed within the processing vessel 1. Assuming that a plasma density within the processing vessel 1 (in a processing atmosphere) when the magnetic fields are formed by the magnetic field forming mechanisms 20 is P1, and a plasma density within the processing vessel 1 when the magnetic fields are not formed is P2, P1 becomes substantially equal to P2. The term "substantially equal" used herein means that P1 is smaller than P2×1.10. In some embodiments, the term means that P1≤P2×1.05. Further, in some embodiments, the term means that P1≤P2×1.01.

The expression "the loops of the magnetic flux lines are not closed" used herein means one of the following instances (a) through (d).

(a) when viewed from the top, there are not formed annular magnetic flux lines surrounding the wafer W.

(b) when viewed from the top, in between one magnetic field forming mechanism 20 and another magnetic field forming mechanism 20 adjacent thereto, there are not formed magnetic flux lines interconnecting said one magnetic field forming mechanism 20 and said another magnetic field forming mechanism 20.

(c) when viewed from the top, the magnetic flux lines are opened in at least one position of a periphery of the wafer W.

(d) even if one wishes to trace the magnetic flux lines around the wafer W from an arbitrary position outside the wafer W, it is impossible to come back to the original position.

Therefore, when the magnetic field forming mechanisms 20 are disposed in a certain layout, it is possible to know, through a simulation, whether the loops of the magnetic flux lines are closed. Although not shown in FIGS. 4 through 7, a region bounded by the eight magnetic field forming mechanisms 20 represents the interior of the processing vessel 1. The magnetic field forming mechanisms 20 are schematically depicted in FIGS. 4 through 7.

The following is a detailed description of the processing vessel 1. A gas shower head 12 used as a process gas supply unit, which is configured to supply a process gas into the processing vessel 1, is installed on a ceiling surface of the processing vessel 1 being faced with the table unit 2. A high-frequency power supply 12a having a frequency of, e.g., 13.56 MHz, is connected to the gas shower head 12 through a matching box 12b in order to turn the process gas to plasma. Further, a high-frequency power supply 3a having a frequency (of, e.g., 430 kHz), which can be followed by ions is connected to the gas shower head 12 through a matching box 3b in order to move the ions existing in the plasma upward and downward. In this embodiment, a silicon-containing raw material gas (e.g., a bis(diethylamino)silane gas) and a reaction gas (e.g., an oxygen gas) reacting with the raw material gas are used as process gases. To supply these process gases, a raw material gas supply path 11a and a reaction gas supply path 11b are connected at one ends to an upper surface of the gas shower head 12.

The gas shower head 12 is configured to prevent the raw material gas and the reaction gas from being mixed with each other therewithin. Specifically, within the gas shower head 12, spaces 13 and 14 for the diffusion of the raw material gas and the reaction gas are formed independently of each other. Below the spaces 13 and 14, gas injection holes 15 communicating with the interior of the processing vessel 1 are formed independently of one another. In FIG. 1, reference numbers 16 and 17 designate a raw material gas reservoir and a reaction gas reservoir, respectively; and a reference number 18 designates a reservoir configured to supply a gas for plasma generation (e.g., an argon (Ar) gas) to the raw material gas supply path 11a and the reaction gas supply path 11b. In FIG. 1, reference numbers 19a and 19b designate a valve and a flow rate control unit, respectively. A reference number 10 designates an insulating member. An exhaust port 31 through which gas inside the processing vessel 1 is exhausted is formed in a sidewall of the processing vessel 1 near the bottom surface of the processing vessel 1. A vacuum pump 34 used as an exhaust mechanism is connected through a pressure control unit 33, such as a butterfly valve or the like, to an exhaust path 32 extending from the exhaust port 31.

The plasma processing apparatus is provided with a control unit 41 including a computer for controlling the operation of the apparatus as a whole. A program to be used in performing a plasma processing (which will be described later) is stored in a memory of the control unit 41. The program is installed into the control unit 41 from a storage unit 42, i.e., a memory medium, such a hard disk, a compact disk, a magneto-optical disk, a memory card or a flexible disk.

Figure 8:
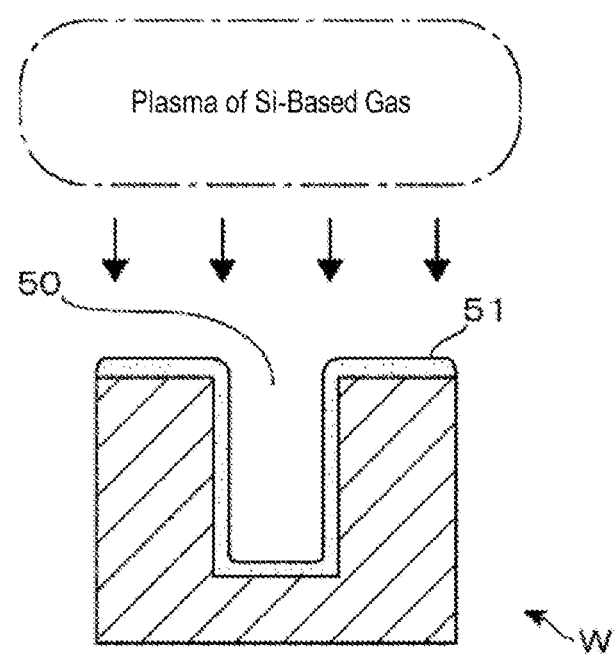
FIG. 8 is a first vertical sectional view of a substrate, schematically showing a process performed according to the first embodiment in the present disclosure.

Next, description will be made on the operation of the plasma processing apparatus according to the first embodiment. First, the table unit 2 is moved to the lower position and the gate valve G is opened. The wafer W is loaded into the processing vessel 1 by a transfer arm (not shown) and is placed on the elevating pins 5. On the surface of the wafer W, there is formed a recess 50 having an aspect ratio of several tens or several hundred as shown in FIG. 8. Then, the table unit 2 is moved upward to place the wafer W thereon and subsequently, the transfer arm is retreated from the processing vessel 1. Subsequently, the gate valve G is closed and the table unit 2 is located at the upper position. An internal pressure of the processing vessel 1 is set to a predetermined process pressure by the pressure control unit 33.

Then, high-frequency power is supplied from the high-frequency power supplies 3a and 12a and simultaneously, each of the switches 24 is turned on so that the magnetic flux lines shown in one of FIGS. 4 through 7 are formed within the processing vessel 1. Subsequently, the gas for plasma generation and the raw material gas are supplied into the processing vessel 1. Then, as shown in FIG. 8, the raw material gas is turned to plasma by the high-frequency power of the high-frequency power supply 12a so that the plasma is generated. The plasma is diffused into the recess 50 formed in the surface of the wafer W so that an atomic layer or a molecular layer formed of components of the raw material gas is adsorbed as an adsorption layer 51 to an exposed surface of the wafer W, including inner wall and bottom surfaces of the recess 50.

Then, while continuously supplying the gas for plasma generation into the processing vessel 1, the supply of the raw material gas is stopped or the supply of the powers from the high-frequency power supplies 3a and 12a is stopped to thereby replace the internal atmosphere of the processing vessel 1. That is, since the interior of the processing vessel 1 is being exhausted, if the supply of the raw material gas is stopped, the raw material gas is rapidly discharged from the interior of the processing vessel 1. Thus, the internal atmosphere of the processing vessel 1 is changed into an inert gas atmosphere (an argon gas atmosphere).

Figure 9:
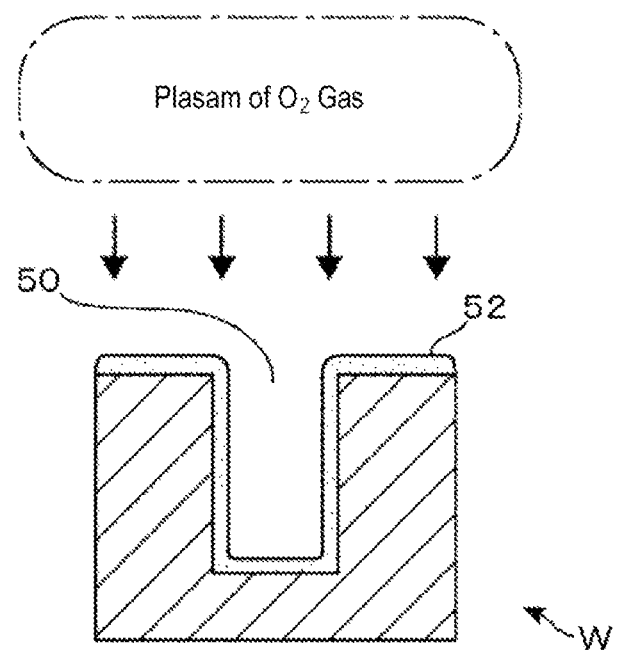
FIG. 9 is a second vertical sectional view of the substrate, schematically showing a process performed according to the first embodiment in the present disclosure.

Subsequently, the reaction gas and the gas for plasma generation are supplied into the processing vessel 1. The reaction gas is turned to plasma by the high-frequency powers supplied from the high-frequency power supplies 3a and 12a, thereby generating plasma. As shown in FIG. 9, the adsorption layer 51 formed on the exposed surface of the wafer W is oxidized by the plasma, which forms a reaction layer 52 composed of a silicon oxide film. A specific quality and thickness of the reaction layer 52 will now be described in detail together with a formation mechanism of the reaction layer 52.

Figure 10:
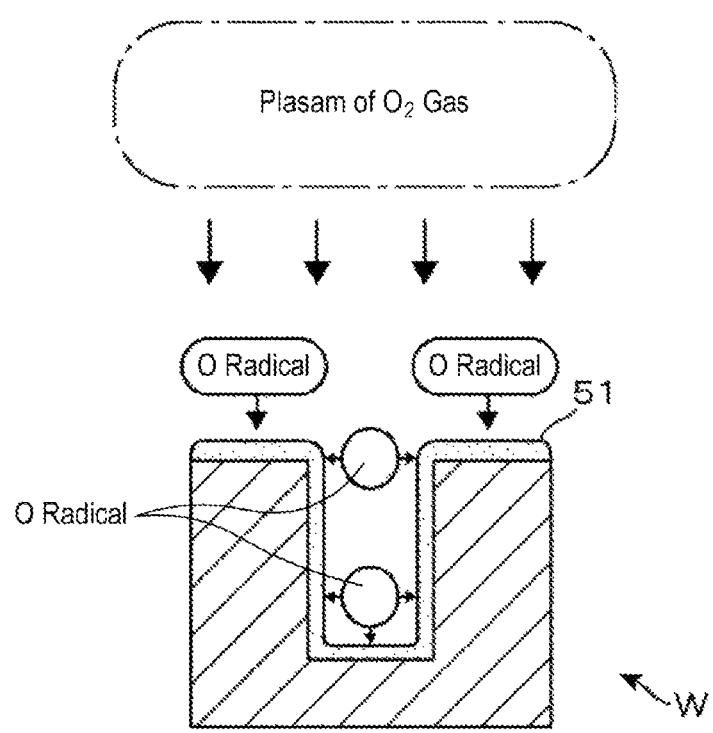
FIG. 10 is a third vertical sectional view of the substrate, schematically showing a process performed according to the first embodiment in the present disclosure.

First, as shown in FIG. 10, for example, oxygen (O) radicals existing in the plasma react with the adsorption layer 51. Specifically, since the oxygen radicals have an extended lifespan and an electrically neutral property, they are diffused into the recess 50 along a gas flow inside the processing vessel 1, while remaining active. When the oxygen radicals impinge against, e.g., the adsorption layer 51 formed on the inner wall surfaces of the recess 50, the oxygen radicals react with the adsorption layer 51, eventually generating a reaction product containing silicon and oxygen. In this way, the reaction product is generated on the exposed surface of the wafer W including the inner wall and bottom surfaces of the recess 50. The reaction product is not so dense because no physical impact is applied to the reaction product by ions or electrons.

Figure 11:
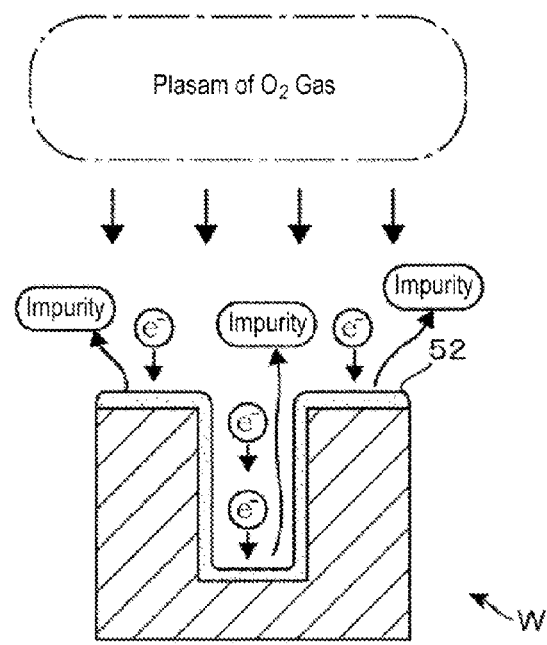
FIG. 11 is a fourth vertical sectional view of the substrate, schematically showing a process performed according to the first embodiment in the present disclosure.
Figure 12:
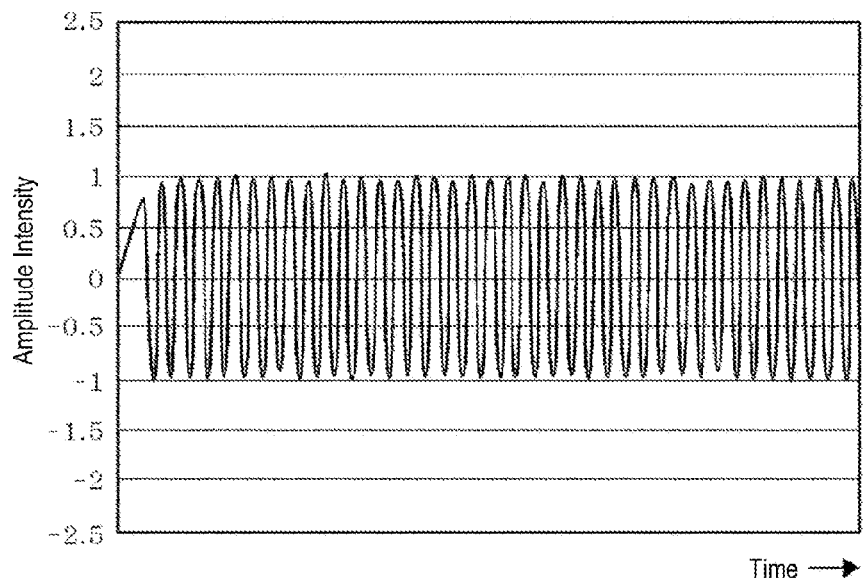
FIG. 12 is a characteristic diagram showing a high-frequency wave for turning a process gas to plasma.
Figure 13:
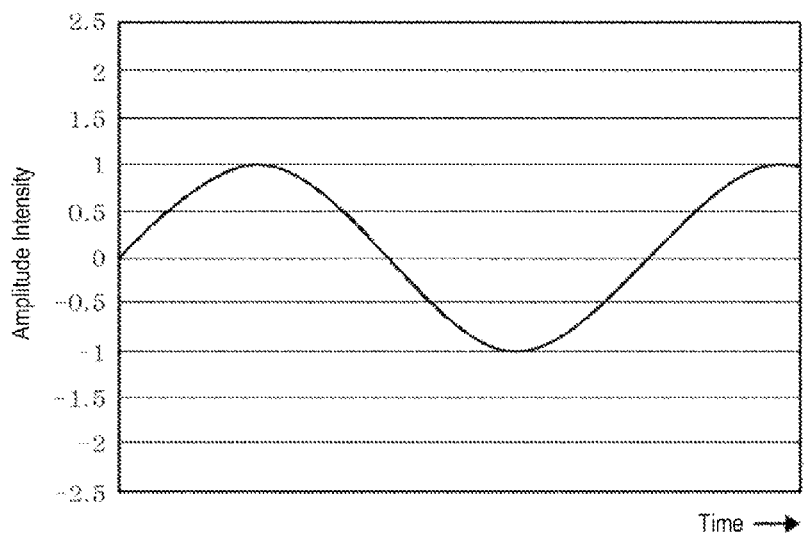
FIG. 13 is a characteristic diagram showing a high-frequency wave for moving ions upward.
Figure 14:
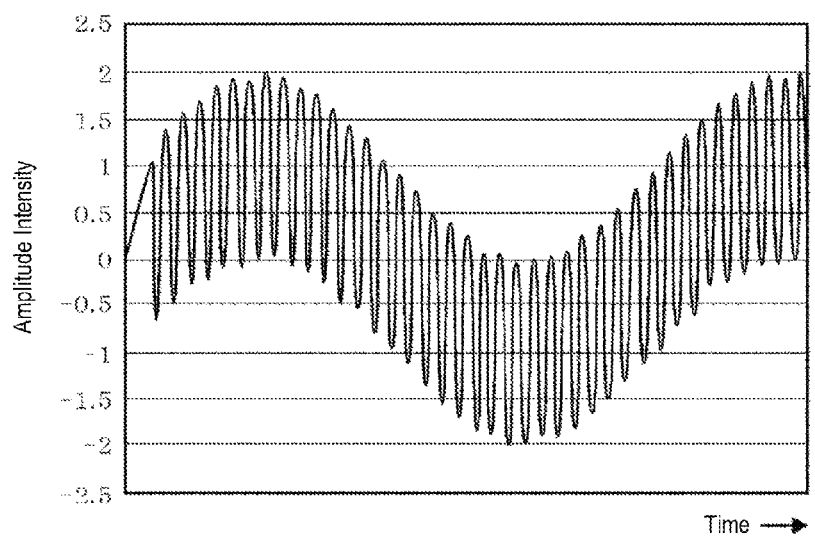
FIG. 14 is a characteristic diagram representing a synthesized characteristic of high-frequency waves supplied into a processing vessel.
Figure 15:
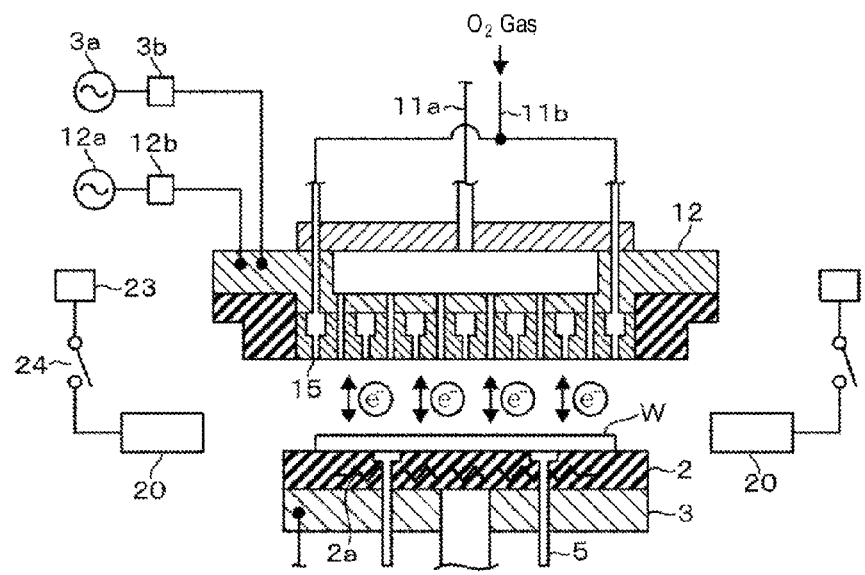
FIG. 15 is an operational view schematically showing a first movement of electrons.

Thereafter, as shown in FIG. 11, electrons contained in the plasma impinge against the reaction product so that impurities existing in the reaction product are expelled, or atoms or molecules existing in the reaction product are rearranged, whereby the reaction product becomes dense. Description will now be made on a behavior of the electrons. As shown in FIG. 12, the aforementioned high-frequency power having a frequency of 13.56 MHz is supplied to the gas shower head 12. Further, as shown in FIG. 13, the high-frequency power having a frequency of 430 kHz is supplied to the gas shower head 12. Accordingly, as shown in FIG. 14, the electrons existing in the processing vessel 1 are moved by a synthetic wave of high-frequency waves supplied from the high-frequency power supplies 3a and 12a. In other words, generally, the electrons existing in the processing vessel 1 are moved upward if the gas shower head 12 is charged positively. On the other hand, the electrons existing in the processing vessel 1 are moved downward if the gas shower head 12 is charged negatively. Thus, as shown in FIG. 15, the electrons are repeatedly vibrated up and down. For this reason, if the electrons are moved only by the high-frequency waves of the high-frequency power supplies 3a and 12a, namely if a thin film is formed using only the high-frequency power supplies 3a and 12a, the densification of the reaction product occurs selectively on the horizontal surface of the wafer W (on the upper surface of the wafer W and the bottom surface of the recess 50). However, the densification of the reaction product is difficult to achieve on the inner wall surfaces of the recess 50.

Figure 16:
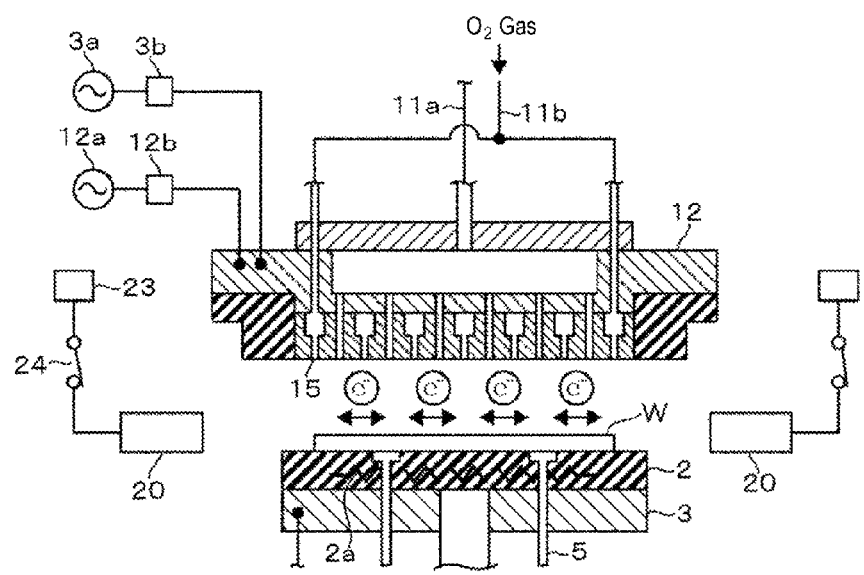
FIG. 16 is an operational view schematically showing a second movement of electrons.
Figure 17:
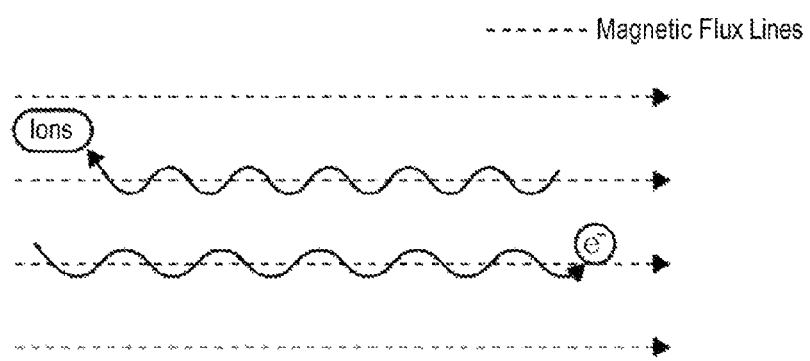
FIG. 17 is an operational view schematically showing a third movement of electrons.

Therefore, magnetic fields are formed within the processing vessel 1 through the use of the magnetic field forming mechanisms 20 to horizontally move the electrons or the ions as shown in FIG. 16. In other words, as shown in FIG. 17, if there are formed the magnetic fields, the electrons are moved in a direction to which the magnetic flux lines are extended (specifically, a direction extending from the N pole to the S pole) while spirally rotating around an axis extending along the magnetic flux lines in the magnetic fields. Oxygen ions existing in the plasma are horizontally moved in a direction opposite to the movement direction of the electrons.

Figure 18:
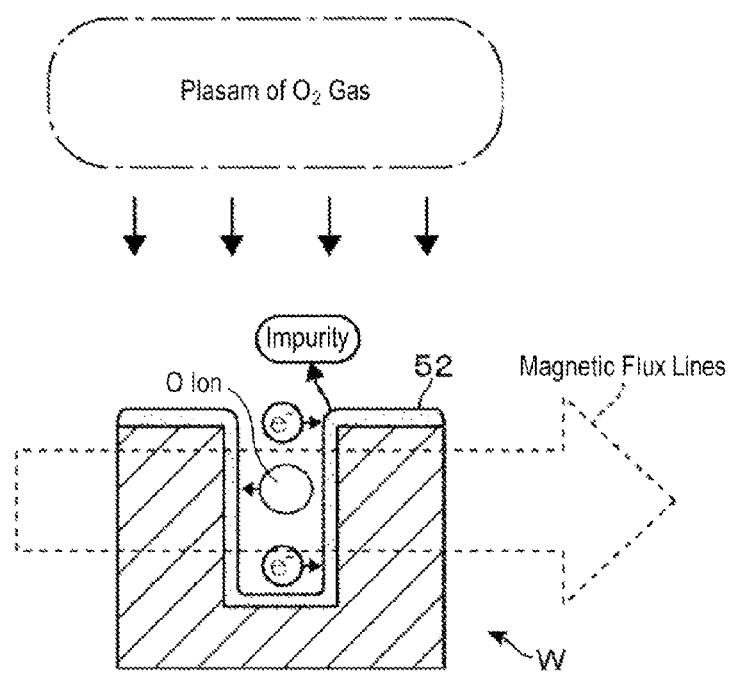
FIG. 18 is an operational view schematically showing a fourth movement of electrons.

Accordingly, as shown in FIG. 18, the electrons impinge against the inner wall surfaces of the recess 50, whereby the reaction product becomes dense. Even if an unreacted adsorption layer 51, which is not reacted with the oxygen radicals, is left on the inner wall surfaces of the recess 50, the oxygen ions existing in the plasma are moved in the direction opposite to the movement direction of the electrons so that the unreacted adsorption layer 51 reacts with the oxygen ions to thereby form the reaction layer 52. Thus, a thickness of a film formed on the inner wall surfaces of the recess 50 is equal to that of a film formed on the horizontal surface of the wafer W.

Figure 19:
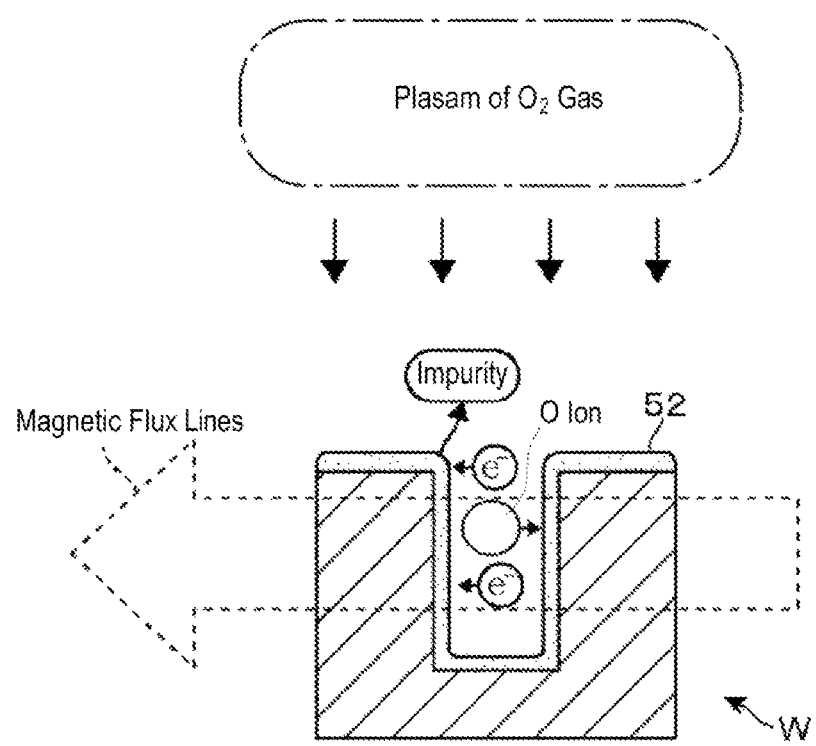
FIG. 19 is an operational view schematically showing a fifth movement of electrons.

As described above, the changeover of the magnetic fields formed within the processing vessel 1 causes a variation in movement route of the electrons and the oxygen ions as shown in FIG. 19, which forms the dense reaction layer 52 on the inner wall surfaces of the recess 50 along the circumferential direction. The changeover of the magnetic fields is performed as shown in the order of FIG. 4→FIG. 5→FIG. 6→FIG. 7. The time required in maintaining a certain magnetic field (the time taken until one magnetic field is changed over to another magnetic field) is set equal to, e.g., 75 nanoseconds to 5 seconds. In some embodiments, the time may be set to 150 nanoseconds to 1 second.

As stated above, loops of the magnetic flux lines when viewed from the top are not closed during a time period when a series of the aforementioned plasma processes is performed. This prevents the plasma from becoming dense within the processing vessel 1, which restrains the wafer W from being damaged. Although the reactions of the adsorption layer 51 with the oxygen radials and the electrons take place instantaneously, for the sake of convenience, the reactions are described as if they occur one after another.

After performing the replacement of the internal atmosphere of the processing vessel 1, the supply of the raw material gas and the supply of the reaction gas are alternately carried out a multiple number of times. When changing over the raw material gas and the reaction gas, the internal atmosphere of the processing vessel 1 is replaced. Consequently, the reaction product is deposited over multiple layers to thereby form a dense thin film.

According to the embodiment described above, when forming the thin film on the wafer W through the use of plasma, the magnetic fields are formed within the processing vessel 1 and the loops of the magnetic flux lines in the magnetic fields when viewed from the top are prevented from being closed. This makes it possible to cause the electrons existing in the plasma to move along the surface of the wafer W while suppressing occurrence of damage in the wafer W. Therefore, even if the recess 50 having a large aspect ratio is formed on the surface of the wafer W, a thin film superior in quality and thickness can be formed not only on the horizontal surface of the wafer W but also on the inner wall surfaces of the recess 50. Since there is no need to keep the interior of the processing vessel 1 at a low pressure in an effort to diffuse active species existing in the plasma, it is possible to form a film at a good (high) film formation speed.

Inasmuch as the magnetic fields formed within the processing vessel 1 are changed over during the film formation process, it is possible to form a thin film having a good quality and a good thickness on the inner wall surfaces of the recess 50 along the circumferential direction. In a case where the wafer W is dipped into a hydrofluoric acid aqueous solution, a high resistance to the hydrofluoric acid aqueous solution is obtained over the entire surface of the wafer W. A rate of etching performed by the hydrofluoric acid aqueous solution becomes uniform throughout the exposed surface of the wafer W including the inner wall surfaces of the recess 50. Since the magnetic field forming mechanisms 20 are disposed outside the processing vessel 1, it is possible to perform the film formation process while suppressing infiltration of metallic impurities.

In the first embodiment described above, the magnetic field forming mechanisms 20 are disposed near the lateral side of the wafer W such that, when impinging the electrons and the ions against the inner wall surfaces of the recess 50, the magnetic flux lines are formed inside the recess 50. Alternatively, the magnetic field forming mechanisms 20 may be disposed only at the upper side of the wafer W. In a case where the electrons and the ions are horizontally moved along the magnetic flux lines at the upper side of the wafer W, even if the magnetic flux lines are not formed inside the recess 50, the electrons and the ions can horizontally move inside the recess 50 under the influence of an inertial force as they go down toward the wafer W. It is therefore possible to obtain the same effects as mentioned above.

While in the above embodiment, the high-frequency power supplies 12a and 3a have been described to be respectively connected to the gas shower head 12, the high-frequency power may be supplied from the high-frequency power supply 12a to each of the gas shower head 12 and the table unit 2. In this case, the high-frequency power is alternately supplied to the gas shower head 12 and the table unit 2. The reason for connecting the high-frequency power supply 12a to each of the gas shower head 12 and the table unit 2 will be described below.

More specifically, the number of the electrons and the number of the ions are equal to each other inside the plasma. This means that the plasma is electrically neutral. In the configuration (anode coupling) in which the high-frequency power supply 12a used in generating plasma is connected to the gas shower head 12, the main reaction active species involving a reaction are radicals and electrons. On the other hand, in the configuration (cathode coupling) in which the high-frequency power supply 12a is connected to the table unit 2, an ion sheath is formed near the wafer W. Therefore, active electrons and ions abundantly exist in the vicinity of the wafer W. Accordingly, the growth rate of a thin film is higher in the cathode coupling than in the anode coupling. Moreover, it is presumed that a coverage (coatability of the thin film on the inner wall surfaces of the recess 50) is improved in the cathode coupling. However, the damage of the wafer W (or devices formed in the wafer W) becomes more severe in the cathode coupling than in the anode coupling.

Figure 20:
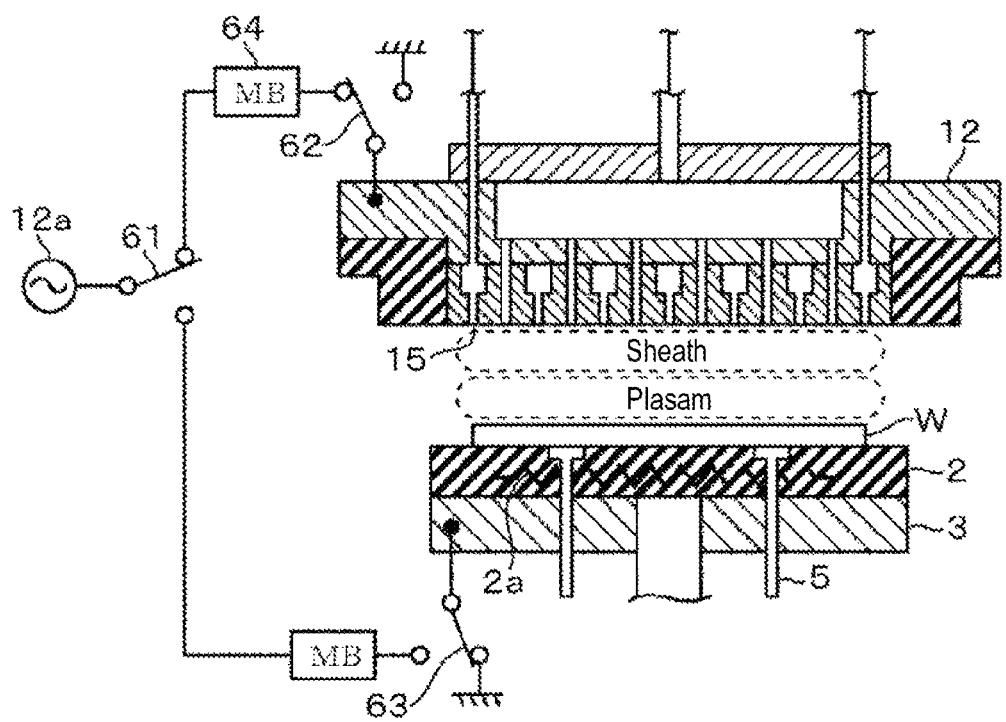
FIG. 20 is a vertical sectional view showing another example of a high-frequency power supply disposed between a gas shower head and a table unit.

Therefore, if the anode coupling and the cathode coupling are used in combination, it is possible, as compared with a case where the anode coupling or the cathode coupling is used independently, to obtain a high film formation speed and a good coverage characteristic while minimizing or suppressing the damage caused by plasma. Specifically, as shown in FIG. 20, the high-frequency power supply 12a is connected to the gas shower head 12 and the table unit 2. A first switch 61 and a second switch 62 are disposed between the high-frequency power supply 12a and the gas shower head 12. The second switch 62 disposed near the gas shower head 12 is operable between a point where the gas shower head 12 is connected to the high-frequency power supply 12a and a point where the gas shower head 12 is connected to ground. On the other hand, the first switch 61 is operable between a point where the high-frequency power supply 12a is connected to the gas shower head 12 and a point where the high-frequency power supply 12a is connected to the table unit 2. A third switch 63 is installed between the first switch 61 and the table unit 2. The third switch 63 is operable between a point where the table unit 2 is connected to the high-frequency power supply 12a and a point where the table unit 2 is connected to the ground. These switches 61, 62 and 63 constitute a high-frequency switching mechanism. In FIG. 20, a reference number 64 designates a matching circuit (matching box: MB) configured to prevent reflection of high-frequency travelling waves.

Figure 21:
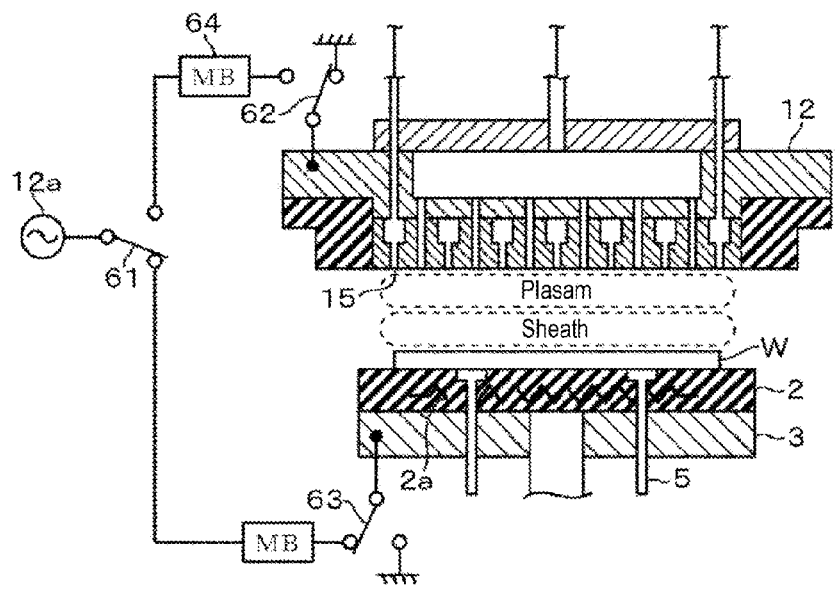
FIG. 21 is a vertical sectional view showing an operation of the high-frequency power supply shown in FIG. 20.
Figure 22:
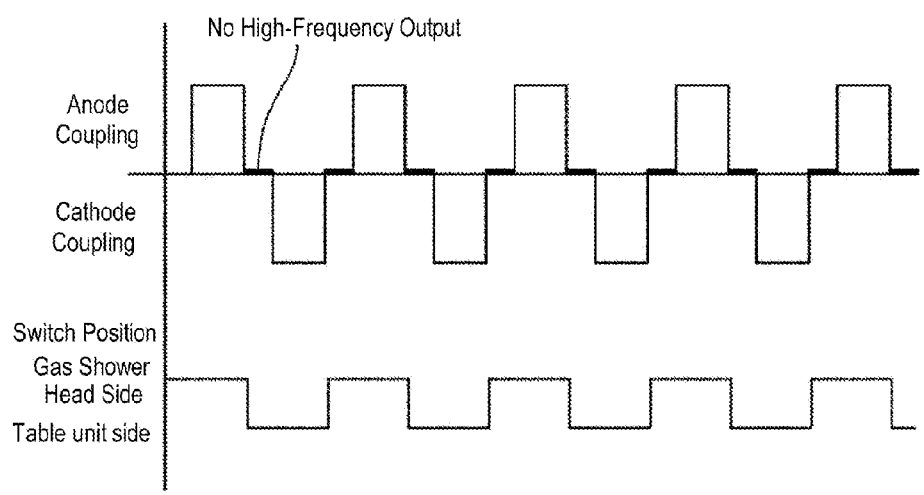
FIG. 22 is a waveform diagram showing an example of a switching sequence of an anode coupling and a cathode coupling in the high-frequency power supply of FIG. 20.

In this configuration, as shown in FIG. 20, the high-frequency power supply 12a is connected to the gas shower head 12 for, e.g., 1 second. Thereafter, as illustrated in FIG. 21, the switches 61, 62 and 63 are operated to connect the high-frequency power supply 12a to the table unit 2 for, e.g., 1 second. In this manner, the high-frequency power supply 12a is alternately connected to the gas shower head 12 and the table unit 2. As a result, it is possible to alternately perform the anode coupling and the cathode coupling. This makes it possible to perform the film formation process by making the most of the advantages of the anode coupling and the cathode coupling set forth above. In other words, the main film formation process is performed by the anode coupling less susceptible to plasma damage. For the sake of coverage improvement, the film formation process is performed by the cathode coupling for only a short period of time. FIG. 22 shows an example of a switching sequence of the anode coupling and the cathode coupling. When operating the switches, the output of the high-frequency waves is kept zero for, e.g., 100 milliseconds, in order to prevent the gas shower head 12 and the table unit 2 from being short-circuited.

Figure 23:
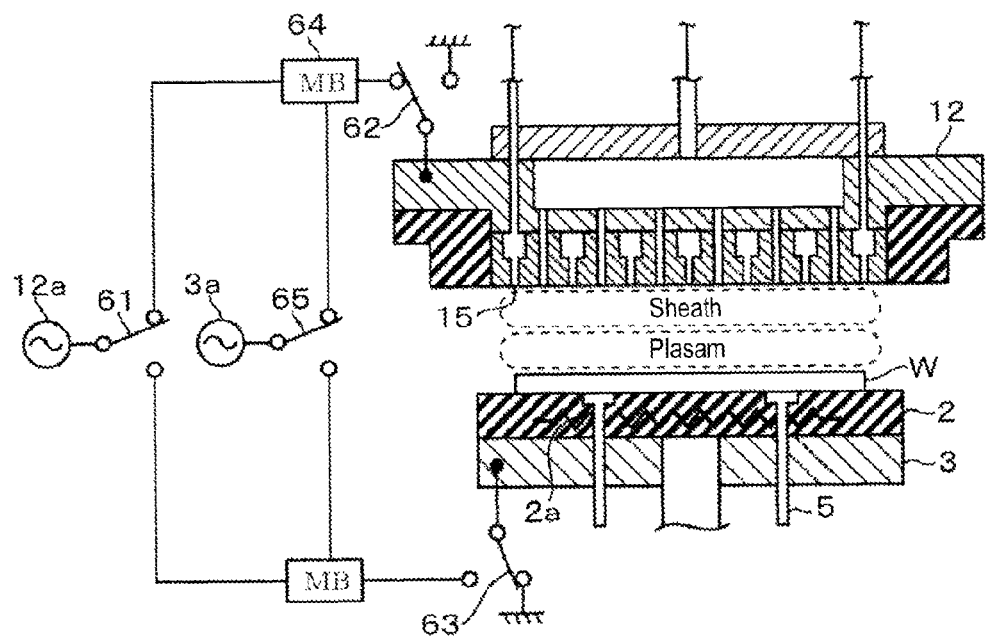
FIG. 23 is a vertical sectional view showing another example of the high-frequency power supply of FIG. 20 disposed between a gas shower head and a table unit.

When switching the anode coupling and the cathode coupling in the aforementioned manner, as shown in FIG. 23, the destination of the high-frequency power outputted from the high-frequency power supply 3a may be switched in a similar manner using the second switch 62 and the third switch 63. In FIG. 23, a reference number 65 designates a fourth switch installed between the high-frequency power supply 3a and the switches 62 and 63 through each of the matching boxes 64.

Figure 24:
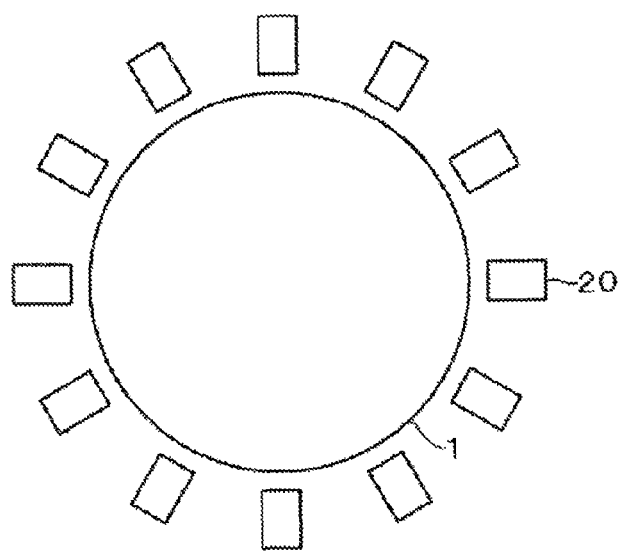
FIG. 24 is a plane view showing another arrangement layout of the magnetic field forming mechanisms.
Figure 25:
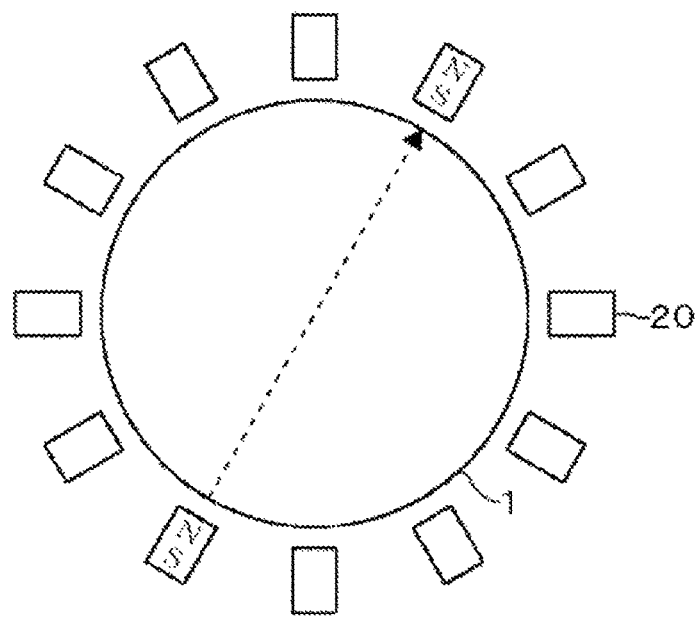
FIG. 25 is a plane view showing a first operation of the another arrangement layout of the magnetic field forming mechanisms.

Description will now be made on another example of the arrangement layout of the magnetic field forming mechanisms 20. FIG. 24 shows an example in which the magnetic field forming mechanisms 20 are disposed outside the processing vessel 1 at a plurality of (e.g., twelve) locations along the circumferential direction of the processing vessel 1. In this example, the magnetic field forming mechanisms 20 are disposed at regular intervals. Accordingly, each of the magnetic field forming mechanisms 20 faces a respective magnetic field forming mechanism 20 across the processing vessel 1. In this configuration, when switching the magnetic fields formed within the processing vessel 1, as shown in FIG. 25, current is applied to one of the magnetic field forming mechanisms 20 such that a magnetic pole thereof existing near the processing vessel 1 is set to, e.g., S pole. Moreover, the current is applied to said respective magnetic field forming mechanism 20 facing said one of the magnetic field forming mechanisms 20 such that a magnetic pole thereof existing near the processing vessel 1 is set to, e.g., N pole. Thus, the magnetic flux lines flowing from said respective magnetic field forming mechanism 20 toward said one magnetic field forming mechanism 20 are formed therebetween. The magnetic flux lines are schematically depicted in FIG. 25.

Figure 26:
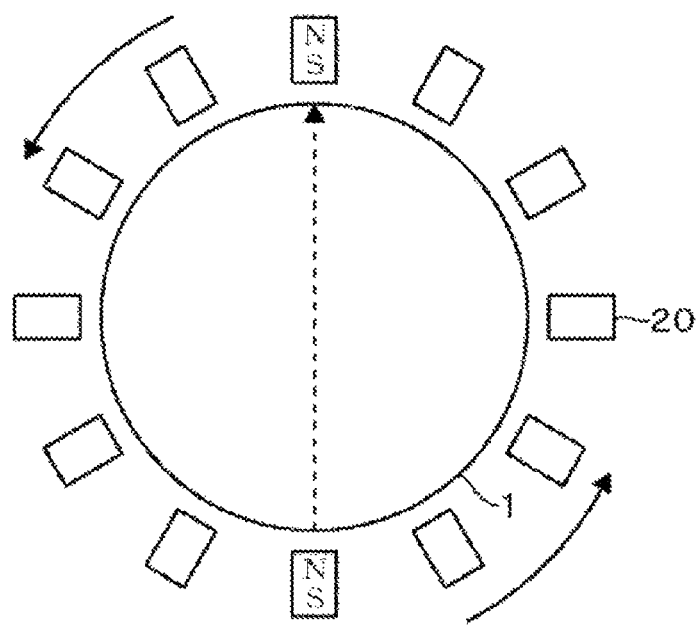
FIG. 26 is a plane view showing a second operation of the another arrangement layout of the magnetic field forming mechanisms.

Subsequently, the applications of the current to said one magnetic field forming mechanism 20 and said respective magnetic field forming mechanism 20 are stopped. As shown in FIG. 26, the current is applied to the magnetic field forming mechanism 20 adjacent to said one magnetic field forming mechanism 20 in a counterclockwise direction such that a magnetic pole thereof existing near the processing vessel 1 is set to, e.g., S pole. Moreover, the current is applied to a counterpart magnetic field forming mechanism 20 facing the adjacent magnetic field forming mechanism 20 such that a magnetic pole thereof existing near the processing vessel 1 is set to, e.g., N pole. Thus, the magnetic flux lines are formed between the magnetic field forming mechanisms 20 and 20 facing each other across the processing vessel 1. It can be said that the magnetic flux lines are rotated about a vertical axis by a small amount (e.g., 30 degrees counterclockwise) from the magnetic flux lines shown in FIG. 25. If the applications of the current to the magnetic field forming mechanisms 20 and 20 are switched one after another along the circumferential direction in the aforementioned manner, the magnetic flux lines formed along a horizontal direction rotate around an axis vertically extending through the center of the processing vessel 1. It is therefore possible to obtain the same effects as mentioned above.

Figure 27:
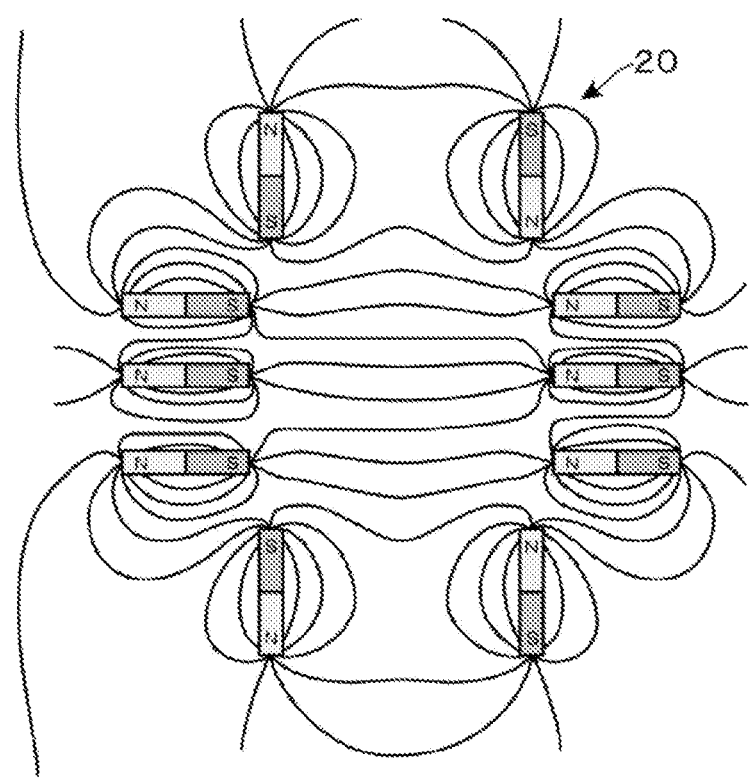
FIG. 27 is a plane view showing magnetic flux lines formed by the magnetic field forming mechanisms disposed in a first configuration.

FIGS. 27 through 32 show other arrangement layouts of the magnetic field forming mechanisms 20 and the results of simulations of magnetic flux lines conducted on the basis of the respective arrangement layouts. Specifically, FIG. 27 shows an example in which two magnetic field forming mechanisms 20 are disposed at the front and rear sides of the processing vessel 1 in a spaced-apart relationship with each other and in which three magnetic field forming mechanisms 20 are disposed at the right and left sides of the processing vessel 1 in a spaced-apart relationship with one another. In the right one of the two magnetic field forming mechanisms 20 disposed at the front and rear sides of the processing vessel, the N pole thereof is oriented to the processing vessel 1. In the left one of the two magnetic field forming mechanisms 20 disposed at the front and rear sides of the processing vessel, the S pole thereof is oriented to the processing vessel 1. In the three magnetic field forming mechanisms 20 disposed at the right side of the processing vessel 1, the N poles thereof are oriented to the processing vessel 1. In the three magnetic field forming mechanisms 20 disposed at the left side of the processing vessel 1, the S poles thereof are oriented to the processing vessel 1.

Figure 28:
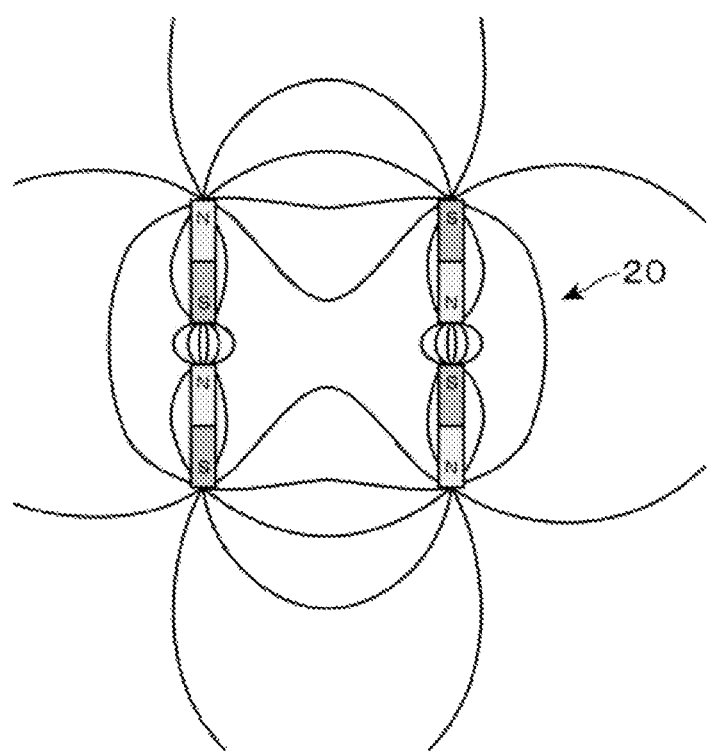
FIG. 28 is a plane view showing magnetic flux lines formed by the magnetic field forming mechanisms disposed in a second configuration.

FIG. 28 shows an example in which the magnetic field forming mechanisms 20 are not disposed at the front and rear sides of the processing vessel 1 and in which two magnetic field forming mechanisms 20 are disposed at the right and left sides of the processing vessel 1. The two magnetic field forming mechanisms 20 disposed at the right side of the processing vessel 1 are disposed such that the N poles thereof are oriented to the front side and the S poles thereof are oriented to the rear side. The two magnetic field forming mechanisms 20 disposed at the left side of the processing vessel 1 are disposed such that the S poles thereof are oriented to the front side and the N poles thereof are oriented to the rear side.

Figure 29:
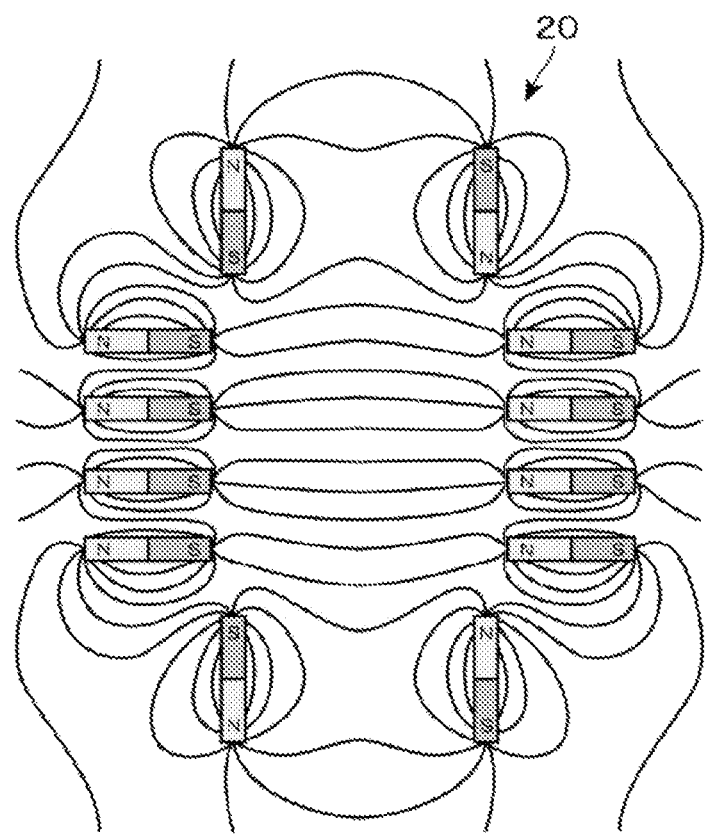
FIG. 29 is a plane view showing magnetic flux lines formed by the magnetic field forming mechanisms disposed in a third configuration.

FIG. 29 shows an example in which, in addition to the magnetic field forming mechanisms 20 shown in FIG. 27, one magnetic field forming mechanism 20 are additionally disposed at the right and left sides of the processing vessel 1. Accordingly, four magnetic field forming mechanisms 20 are disposed at the right side of the processing vessel 1. In these four magnetic field forming mechanisms 20, the N poles thereof are oriented to the processing vessel 1. Similarly, four magnetic field forming mechanisms 20 are disposed at the left side of the processing vessel 1. In these four magnetic field forming mechanisms 20, the S poles thereof are oriented to the processing vessel 1.

Figure 30:
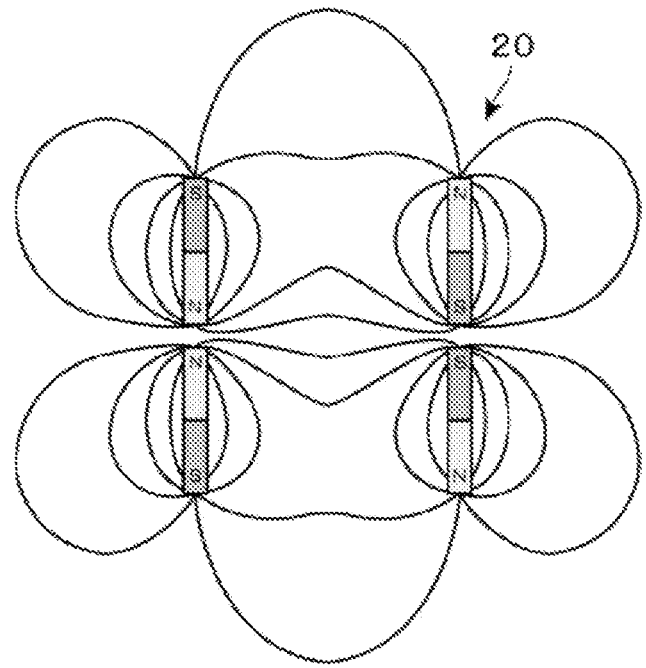
FIG. 30 is a plane view showing magnetic flux lines formed by the magnetic field forming mechanisms disposed in a fourth configuration.
Figure 31:
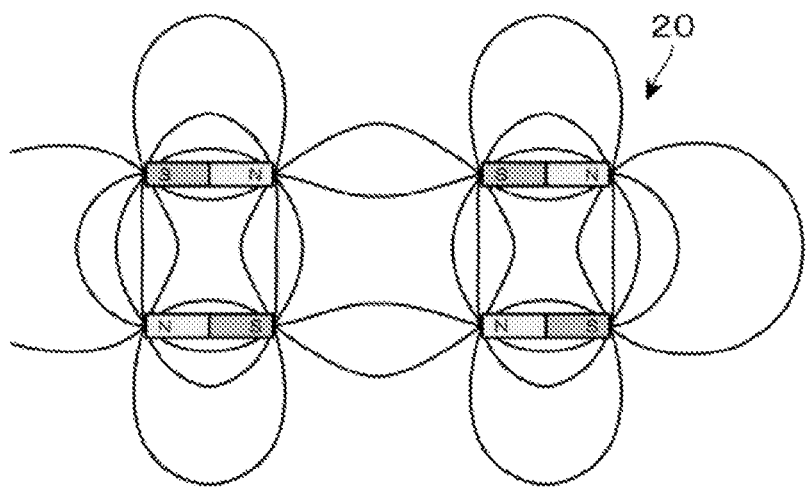
FIG. 31 is a plane view showing magnetic flux lines formed by the magnetic field forming mechanisms disposed in a fifth configuration.
Figure 32:
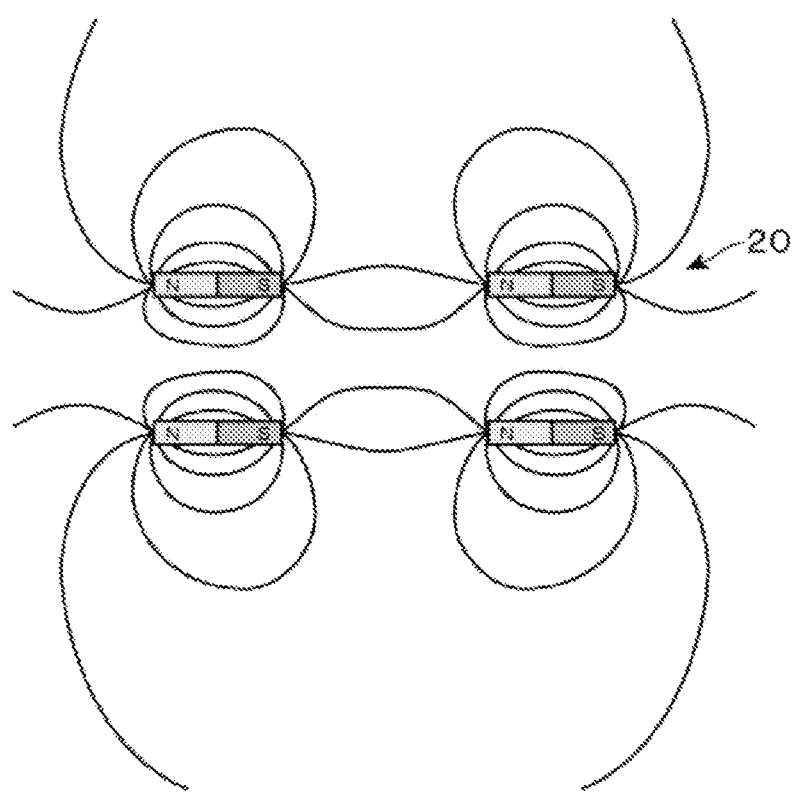
FIG. 32 is a plane view showing magnetic flux lines formed by the magnetic field forming mechanisms disposed in a sixth configuration.

FIG. 30 shows an example in which a magnetic pole of the rear one of the magnetic field forming mechanisms 20 disposed at the right side of the processing vessel 1 and a magnetic pole of the rear one of the magnetic field forming mechanisms 20 disposed at the left side of the processing vessel 1 are inverted with respect to those shown in FIG. 28. FIG. 31 shows an example in which two magnetic field forming mechanisms 20 disposed at the right side of the processing vessel 1 are rotated by 90 degrees clockwise with respect to those shown in FIG. 30 and in which two magnetic field forming mechanisms 20 disposed at the left side of the processing vessel 1 are rotated by 90 degrees counterclockwise with respect to those shown in FIG. 30. FIG. 32 shows an example in which the rear one of the two magnetic field forming mechanisms 20 disposed at the right side of the processing vessel 1 and the rear one of the two magnetic field forming mechanisms 20 disposed at the left side of the processing vessel 1 are inverted by 180 degrees with respect to those shown in FIG. 31. It can be noted that loops of the magnetic flux lines are not closed in any of the arrangement layouts shown in FIGS. 27 to 32.

Figure 33:
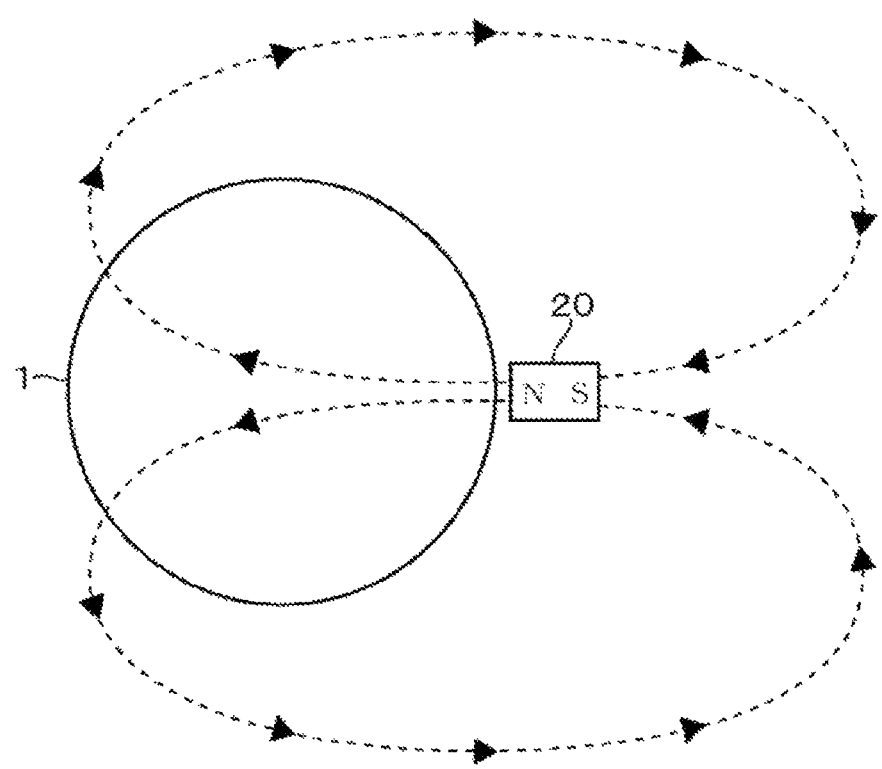
FIG. 33 is a plane view showing magnetic flux lines formed by the magnetic field forming mechanisms disposed in a seventh configuration.
Figure 34:
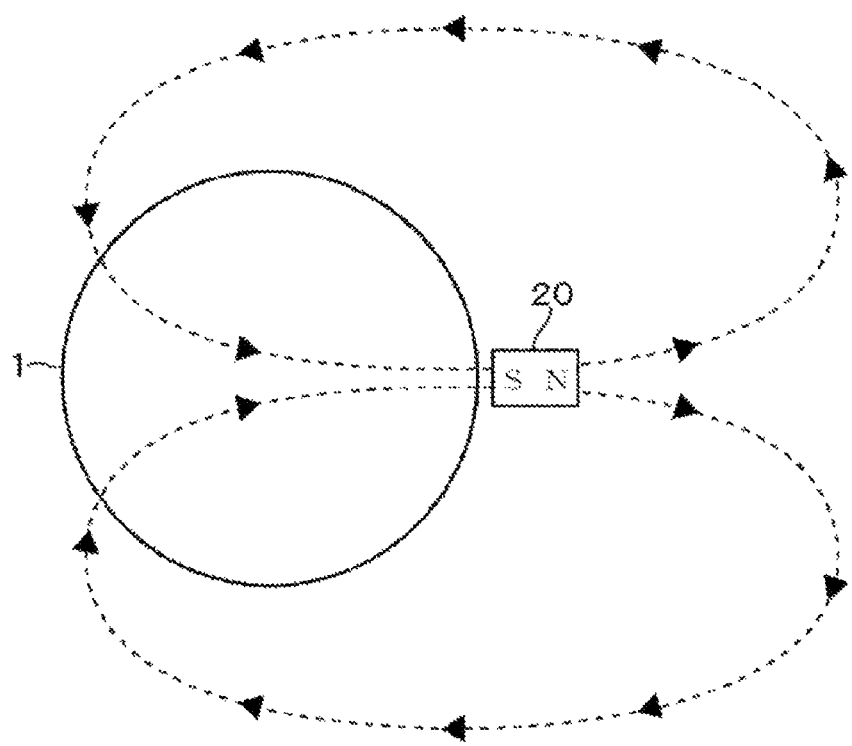
FIG. 34 is a plane view showing magnetic flux lines formed by the magnetic field forming mechanisms disposed in an eighth configuration.
Figure 35:
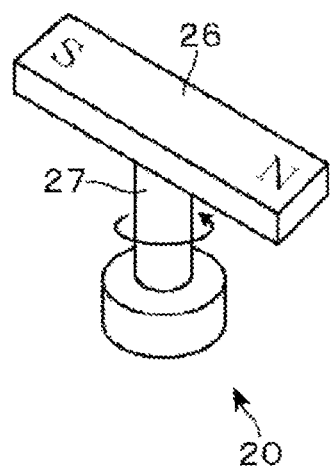
FIG. 35 is a perspective view showing a magnetic field forming mechanisms employed in one or more embodiments of the present disclosure.

While in the above examples, the magnetic flux lines have been described to be formed using the plurality of magnetic field forming mechanisms 20, only a single magnetic field forming mechanism 20 may be used. Even in this case, the magnetic flux lines formed within the processing vessel 1 are inverted upon switching magnetic poles of the single magnetic field forming mechanism 20 as shown in FIGS. 33 and 34, which makes it possible to obtain the same effects as mentioned above. In the above examples, when switching the magnetic poles, electromagnets are used as the magnetic field forming mechanisms 20. Instead of the electromagnet, as shown in FIG. 35, a rotating shaft 27 for supporting, from below, a magnet member 26 formed of a permanent magnet, may be used to rotate the magnet member 26 around a vertical axis.

Figure 36:
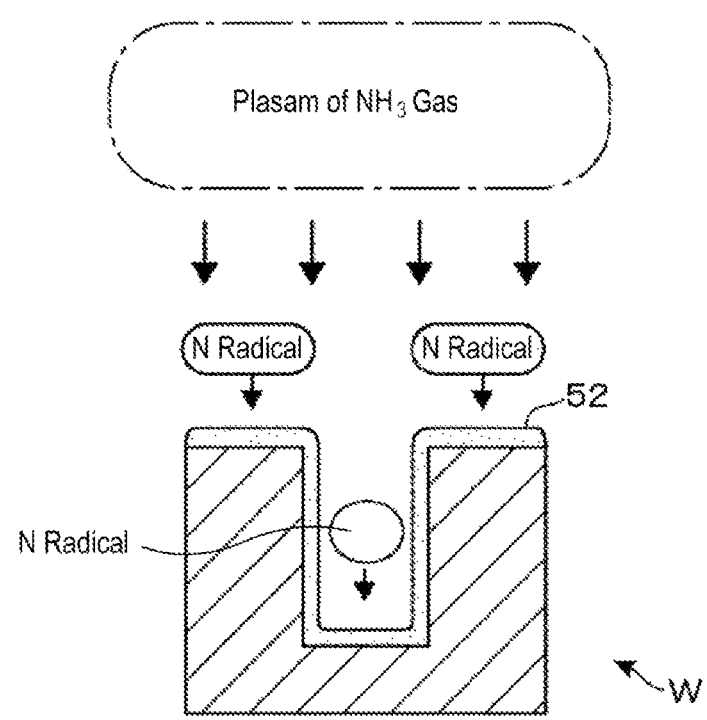
FIG. 36 is a vertical sectional view of a substrate, showing a first operation of a silicon nitride film forming process according to another example of the first embodiment of the present disclosure.

In a case where the thin film is formed by the ALD method as described above, in place of the silicon oxide film, a silicon nitride film may be formed using a reservoir for a reaction gas containing nitrogen (N), e.g., an ammonia ($NH_3$) gas, as the reaction gas reservoir 17. More specifically, the silicon nitride film is formed by forming the adsorption layer 51 made up of the atomic layer or the molecular layer containing silicon and then supplying the plasma, which is obtained by turning the ammonia gas to plasma, to the wafer W as shown in FIG. 36.

The plasma contains nitrogen radicals. The silicon nitride film is formed as the nitrogen radicals react with the adsorption layer 51. The nitrogen radicals are shorter in lifespan than, e.g., the aforementioned oxygen radicals. Nitrogen-containing ions (NH ions) are contained in the plasma. These ions are heavier than electrons and are difficult to move in the horizontal direction.

Figure 37:
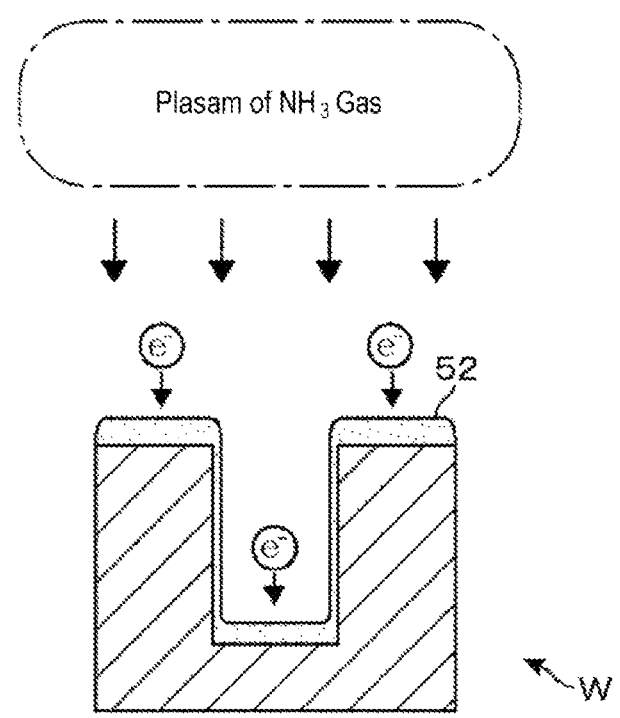
FIG. 37 is a vertical sectional view of the substrate, showing a second operation of a silicon nitride film forming process according to another example of the first embodiment of the present disclosure.
Figure 38:
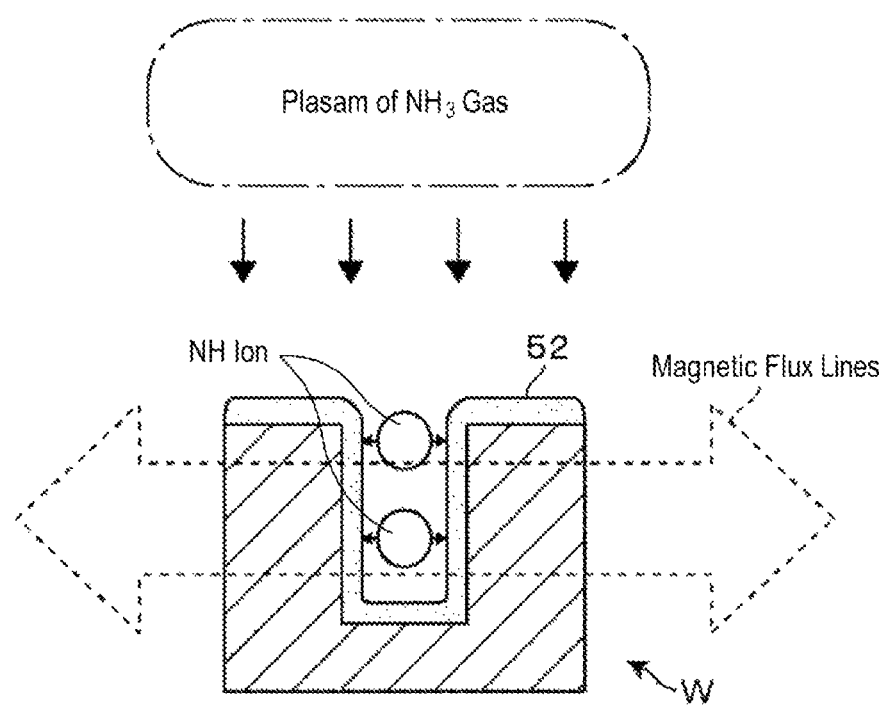
FIG. 38 is a vertical sectional view of the substrate, showing a third operation of a silicon nitride film forming process according to another example of the first embodiment of the present disclosure.

Therefore, the nitrogen radicals and the nitrogen-containing ions reach the horizontal surface of the wafer W including the upper surface of the wafer W or the bottom surface of the recess 50, as the nitrogen radicals and the nitrogen-containing ions move downward while remaining active. Thus, a silicon nitride film is formed on the horizontal surface of the wafer W. On the other hand, in order to form the silicon nitride film on the inner wall surfaces of the recess 50 in case where the magnetic fields are not formed within the processing vessel 1, it is necessary to wait until the nitrogen radicals are horizontally diffused after being introduced into the recess 50. For that reason, it is sometimes the case that the nitrogen radicals are inactivated prior to impinging against the inner wall surfaces of the recess 50. Even if the inactivated nitrogen radicals impinge against the inner wall surfaces of the recess 50, the silicon nitride film is not formed. Consequently, the thickness of the film formed on the inner wall surfaces of the recess 50 tends to become smaller than the thickness of the film formed on the horizontal surface of the wafer W. As shown in FIG. 37, the silicon nitride film formed by the impingement of the nitrogen radicals is made dense by the impingement of electrons. Just like the silicon oxide film described above, the silicon nitride film formed on the inner wall surfaces of the recess 50 is hardly made dense by merely installing the high-frequency power supplies 12a and 3a.

Figure 39:
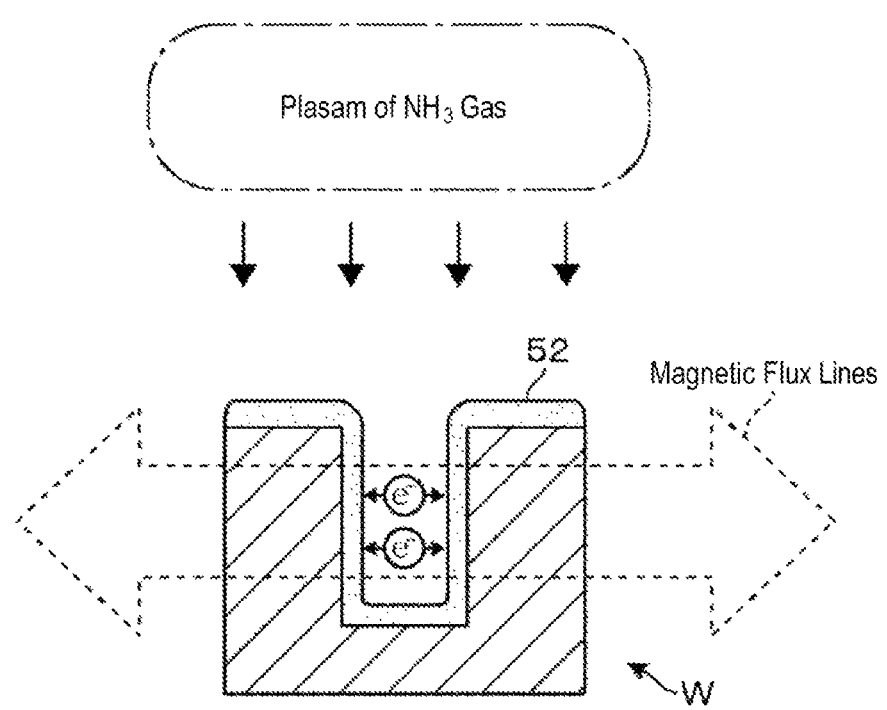
FIG. 39 is a vertical sectional view of the substrate, showing a fourth operation of a silicon nitride film forming process according to another example of the first embodiment of the present disclosure.

Therefore, if the magnetic flux lines extending in the horizontal direction are formed within the processing vessel 1 and if the magnetic flux lines are switched during the film formation process as described above, the nitrogen-containing ions (NH ions) existing in the plasma move in the horizontal direction within the recess 50. Eventually, the reaction for formation of the adsorption layer 51 occurs rapidly on the inner wall surfaces of the recess 50. Moreover, the electrons existing in the plasma impinge against the reaction layer 52 as shown in FIG. 39. Accordingly, a silicon nitride film having the same thickness and quality as those of the silicon nitride film formed on the horizontal surface of the wafer W is formed on the inner wall surfaces of the recess 50.

Other thin films than the silicon oxide film or the silicon nitride film may be formed by the ALD method. For example, a $HfO_2$ film or a $ZrO_2$ film may be formed using, as the raw material gas, a TEMAH (tetrakis(ethylmethylamino) hafnium) gas, a TDMAH (tetrakis(dimethylamino)hafnium gas or a TEMAZ (tetrakis(ethylmethylamido)zirconium) and using, as the reaction gas, an $O_3$ gas, an $O_2$ gas or a $H_2O$ gas. The plasma processing may be performed in a state where magnetic fields are applied to only one of the raw material gas and the reaction gas. In other words, when forming the silicon oxide film as described above, a good adsorption layer 51 is formed even if magnetic fields are not applied to the raw material gas. Accordingly, the plasma processing may be performed while applying magnetic fields to only one of the raw material gas and the reaction gas.

Even when a film is formed by a CVD method while simultaneously supplying a raw material gas and a reaction gas into the processing vessel 1, the same effects as available in the aforementioned examples can be obtained by forming magnetic fields within the processing vessel 1. In case of the CVD method, if the raw material gas and the reaction gas are simultaneously supplied into the processing vessel 1, a reaction product is produced by a vapor-phase reaction of the raw material gas and the reaction gas and is adsorbed to the exposed surface of the wafer W. Therefore, in order to satisfactorily form a thin film within the recess 50, it is necessary to diffuse active species into the recess 50 as far as possible.

For the introduction of the active species into the recess 50, the conventional apparatus not provided with the magnetic field forming mechanisms 20 employs a method of reducing an internal pressure of the processing vessel 1 to facilitate diffusion of gases (active species). As such, in the conventional apparatus, even if the active species are introduced into the recess 50, a film formation speed is decreased because a film formation pressure remains low. On the other hand, if the internal pressure of the processing vessel 1 is increased in order to increase the film formation speed, the active species are difficult to diffuse. This deteriorates the coatability of the active species within the recess 50. In other words, if the conventional CVD method is used in an effort to form a thin film on the wafer W having the recess 50 with high coatability, it is difficult to rapidly form the thin film with high coatability because the film formation speed and the coatability are in a trade-off relationship.

In the present method described above, however, the electrons and the ions are moved in the horizontal direction. Therefore, as compared with the conventional method stated above, the active species are easily introduced into the recess 50, thus increasing the concentration of the active species in the vicinity of the inner wall surfaces of the recess 50. Accordingly, even when a thin film is formed on the wafer W having the recess 50 by the CVD method, it is possible to rapidly form the thin film with high coatability. In the aforementioned embodiment, when placing the wafer W onto the table unit 2, an electrostatic chuck (not shown) may be embedded in the table unit 2 to electrostatically adsorb the wafer W.

[Second Embodiment: Semi-Batch Type Plasma Processing Apparatus]

Figure 40:
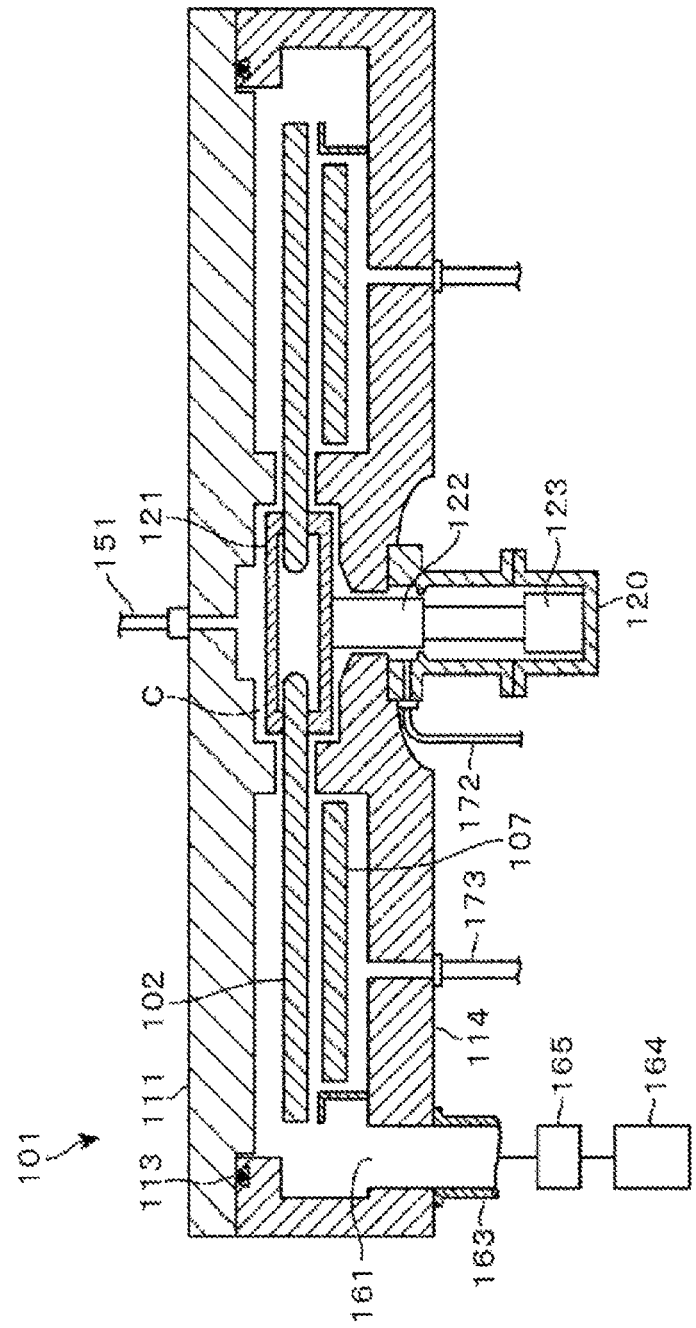
FIG. 40 is a vertical sectional view showing an example of a plasma processing apparatus according to a second embodiment of the present disclosure.

Next, as a second embodiment of the present disclosure, a semi-batch type plasma processing apparatus which simultaneously forms films on a plurality of (e.g., five) wafers W within a common processing vessel will be described with reference to FIGS. 40 through 44. The semi-batch type plasma processing apparatus includes a vacuum vessel 101 used as a processing vessel having a substantially circular shape when viewed from the top, and a rotary table 102 used as a table unit having a rotation axis extending through the center of the vacuum vessel 101. The rotary table 102 is installed within the vacuum vessel 101. In order to prevent different process gases from being mixed with one another in a central region C of the vacuum vessel 101, an isolating gas supply pipe 151 configured to supply a nitrogen ($N_2$) gas therethrough is connected to the central portion of an upper surface of a ceiling plate 111 of the vacuum vessel 101. In FIG. 40, a reference number 113 designates a seal member, e.g., an O-ring. A reference number 107 designates a heating unit installed between a bottom surface portion 114 of the vacuum vessel 101 and the rotary table 102. In FIG. 40, a reference number 173 designates a purge gas supply pipe for purging a space in which the heating unit 107 is disposed.

The rotary table 102 is fixed in its central portion to a substantially cylindrical core member 121 and is rotatable around a vertical axis by a vertically-extended rotating shaft 122 which is connected to a lower surface of the core member 121. In FIG. 40, a reference number 123 designates a drive unit configured to rotate the rotating shaft 122 around the vertical axis. A reference number 120 designates a case for accommodating the rotating shaft 122 and the drive unit 123.

A purge gas supply pipe 172 for supplying therethrough a nitrogen gas as a purge gas to a region defined below the rotary table 102 is connected to the case 120.

Figure 41:
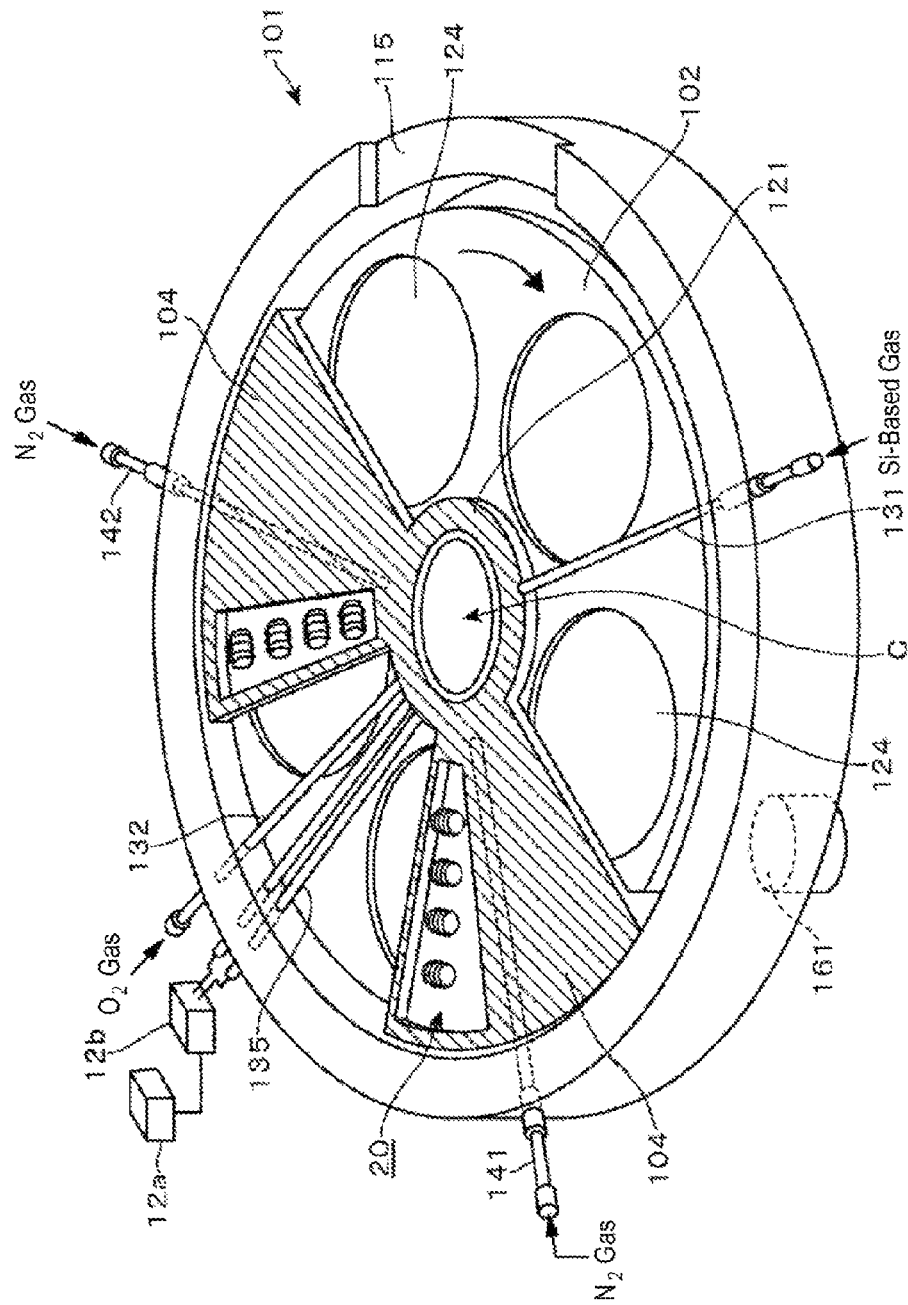
FIG. 41 is a perspective view of the plasma processing apparatus of FIG. 40.
Figure 42:
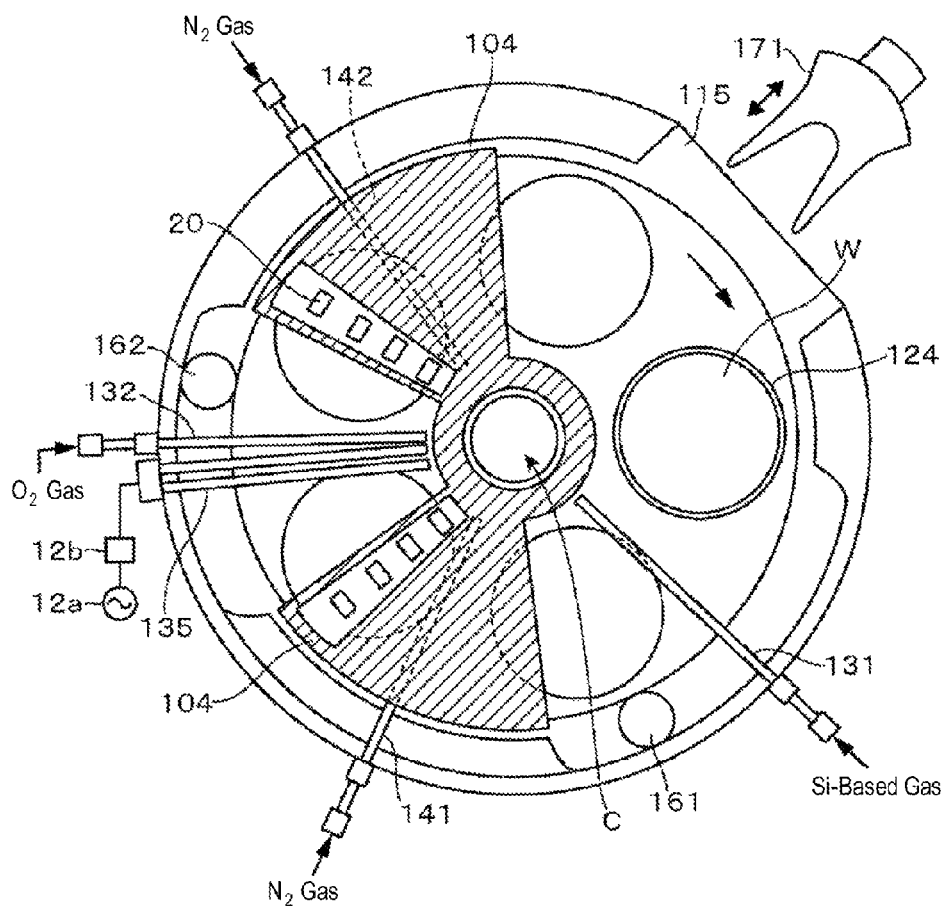
FIG. 42 is a horizontal sectional view of the plasma processing apparatus of FIG. 40.

As shown in FIGS. 41 and 42, circular recess portions 124 for receiving and holding wafers W are formed as substrate placing regions on a front surface of the rotary table 102. The recess portions 124 are formed at a plurality of (e.g., five) locations along a rotational direction (circumferential direction) of the rotary table 102. In upper locations facing regions through which the recess portions 124 pass, four nozzles 131, 132, 141 and 142 are radially arranged in a mutually spaced-apart relationship along the circumferential direction of the vacuum vessel 101. These nozzles 131, 132, 141 and 142 are respectively installed to horizontally extend, e.g., from an outer peripheral wall of the vacuum vessel 101 toward a central region C in a facing relationship with the wafers W. In this embodiment, a first process gas nozzle 131, an isolating gas nozzle 141, a second process gas nozzle 132 and an isolating gas nozzle 142 are disposed in that order in the clockwise direction (the rotational direction of the rotary table 102) when seen from a transfer port 115 (which will be described later).

Each of the nozzles 131, 132, 141 and 142 is connected to a respective gas source (not shown) through a respective flow rate control valve. Specifically, the first process gas nozzle 131, which makes up a raw material gas supply path, is connected to the aforementioned raw material gas reservoir. The second process gas nozzle 132, which makes up a reaction gas supply path, is connected to the reaction gas reservoir. The isolating gas nozzles 141 and 142 are respectively connected to a gas source for supplying a nitrogen gas as an isolating gas. On lower surfaces of the nozzles 131, 132, 141 and 142, a plurality of gas injection holes 133 (see FIG. 44) are formed along a radial direction of the rotary table 102.

Figure 43:
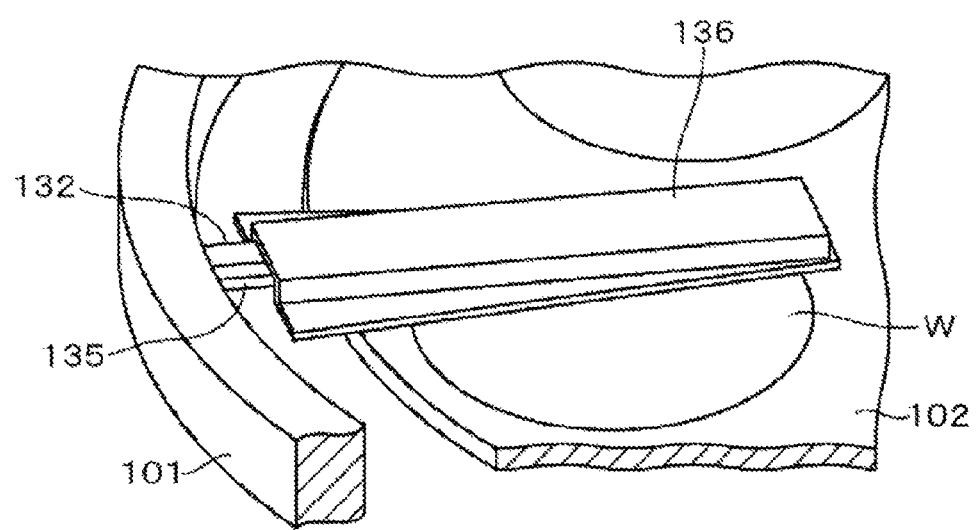
FIG. 43 is a partially enlarged perspective view of the plasma processing apparatus of FIG. 40.

At the front side of the second process gas nozzle 132 in the rotational direction of the rotary table 102, there is disposed a pair of opposing electrodes 135 and 135 that makes up a plasma generating unit configured to turn the reaction gas discharged from the second process gas nozzle 132 to plasma. More specifically, the opposing electrodes 135 and 135 extend in the radial direction of the rotary table 102 along the second process gas nozzle 132. Base ends of the opposing electrodes 135 and 135 air-tightly pass through the sidewall portion of the vacuum vessel 101 and are connected to the high-frequency power supply 12a via the matching box 12b. As shown in FIG. 43, upper surfaces and side surfaces of the second process gas nozzle 132 and the opposing electrodes 135 and 135 are covered with a substantially box-shaped cover member 136 having an open lower surface and extending along the longitudinal direction of the second process gas nozzle 132 and the opposing electrodes 135 and 135. In the figures other than FIG. 43, the depiction of the cover member 136 is omitted. The surfaces of the opposing electrodes 135 and 135 are coated with an insulating material made of, e.g., quartz, although not shown herein.

Figure 44:
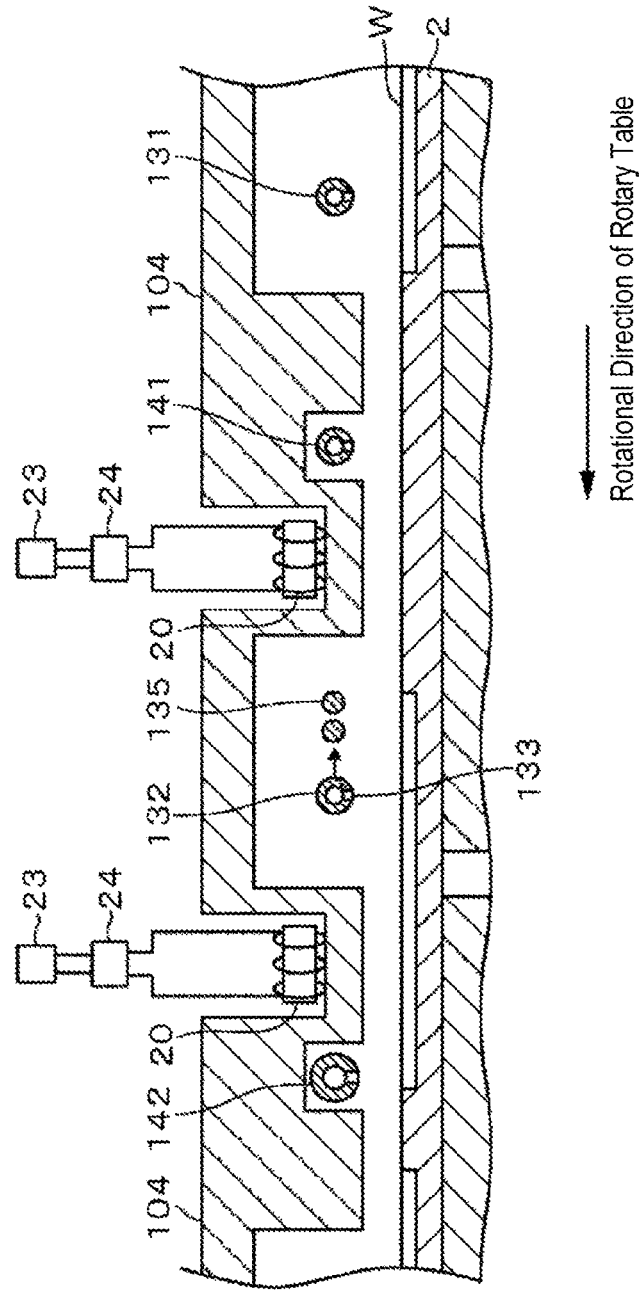
FIG. 44 is a schematic vertical sectional view of the plasma processing apparatus of FIG. 40.

As shown in FIGS. 41, 42 and 44, protrusion portions 104 having a substantially sector-like shape are formed on the ceiling plate 111 of the vacuum vessel 101 in regions where the isolating gas nozzles 141 and 142 are disposed. The isolating gas nozzles 141 and 142 are accommodated within the protrusion portions 104. At the opposite sides of the isolating gas nozzles 141 and 142 along the circumferential direction of the rotary table 102, low ceiling surfaces as the lower surfaces of the protrusion portions 104 are disposed so as to prevent the respective process gases from being mixed with one another. Other ceiling surfaces higher than the low ceiling surfaces are disposed at the opposite sides of the low ceiling surfaces along the circumferential direction of the rotary table 102. FIG. 44 is a vertical sectional view taken along the circumferential direction of the vacuum vessel 101.

As shown in FIG. 44, in each of the protrusion portions 104 and 104, regions defined between the respective isolating gas nozzles 141 and 142 and the second reaction gas nozzle 132 are depressed into a substantially box-like shape along the radial direction of the rotary table 102. The magnetic field forming mechanisms 20 described earlier are respectively arranged in the depressed portions. As shown in FIGS. 41 and 42, the magnetic field forming mechanisms 20 are installed at a plurality of (e.g., four) locations along the radial direction of the rotary table 102 and are respectively connected to the DC power supply 23 via the switches 24 as set forth above. With this configuration, when viewed from the second process gas nozzle 132, the magnetic field forming mechanisms 20 are disposed at the front and back sides of the rotational direction of the rotary table 102 so as to face one another along the rotational direction of the rotary table 102. The magnetic field forming mechanisms 20 are configured to switch the magnetic poles thereof facing the second process gas nozzle 132. In FIG. 42, the switches 24 and the DC power supply 23 are not shown. In FIG. 44, the switches 24 and the DC power supply 23 are shown in a simplified manner.

Two exhaust ports 161 and 162 are formed in the bottom surface portion 114 between the rotary table 102 and the inner wall surfaces of the vacuum vessel 101 (see FIGS. 40 and 41). The two exhaust ports 161 and 162 are referred to as a first exhaust port 161 and a second exhaust port 162, respectively. The first exhaust port 161 is formed between the first process gas nozzle 131 and the protrusion portion 104 existing at the back side of the first process gas nozzle 131 in the rotational direction of the rotary table 102. The second exhaust port 162 is formed between the second process gas nozzle 132 and the protrusion portion 104 existing at the back side of the second process gas nozzle 132 in the rotational direction of the rotary table 102. As shown in FIG. 40, each of the first exhaust port 161 and the second exhaust port 162 is connected to a vacuum pump 164 used as an exhaust mechanism by an exhaust pipe 163 in which a pressure control unit 165 such as a butterfly valve or the like is installed. In FIG. 42, a reference number 115 designates a transfer port. The wafers W are loaded and unloaded through the transfer port 115 by an external transfer arm 171. Elevating pins (all of which are not shown) extending through-holes formed on the rotary table 102, which lift up the wafer W from below, are installed below the rotary table 102 in a location adjacent the transfer port 115.

Next, description will be made on an operation of the semi-batch type plasma processing apparatus. Initially, while intermittently rotating the rotary table 102, the transfer arm 171 places, e.g., five wafers W, on the rotary table 102 through the transfer port 115. Subsequently, the vacuum vessel 101 is hermetically sealed and the internal pressure of the vacuum vessel 101 is set at a predetermined film formation pressure. Then, the rotary table 102 is rotated clockwise at, e.g., 2 rpm to 240 rpm, and the wafers W are heated by the heating unit 107.

Subsequently, the raw material gas and the reaction gas are injected from the process gas nozzles 131 and 132. High-frequency power is supplied to between the opposing electrodes 135 and 135, thereby turning the reaction gas to plasma. Current is applied to the respective magnetic field forming mechanisms 20 in such a way that, when viewed from the top, a loop of magnetic flux lines surrounding the second process gas nozzle 132 are not formed. An isolating gas is injected from the isolating gas nozzles 141 and 142 at a predetermined flow rate. A nitrogen gas is injected from the isolating gas supply pipe 151 and the purge gas supply pipe 172 at a predetermined flow rate.

If the wafer W loaded on the rotary table 102 reaches a position below the first process gas nozzle 131, the adsorption layer 51 is formed on the exposed surface of the wafer W in the aforementioned manner. If the wafer W having the adsorption layer 51 formed thereon arrives below the second process gas nozzle 132, the reaction layer 52 is formed by the oxygen radicals. Since the electrons are horizontally moved by the magnetic fields, the densification of the reaction layer 52 proceeds. If the rotary table 102 is rotated a multiple number of times while, as in the aforementioned examples, switching the magnetic fields formed within the vacuum vessel 101, the reaction layers 52 are deposited on the respective wafers W. Thus, the thin film is formed on each of the wafers W.

Figure 45:
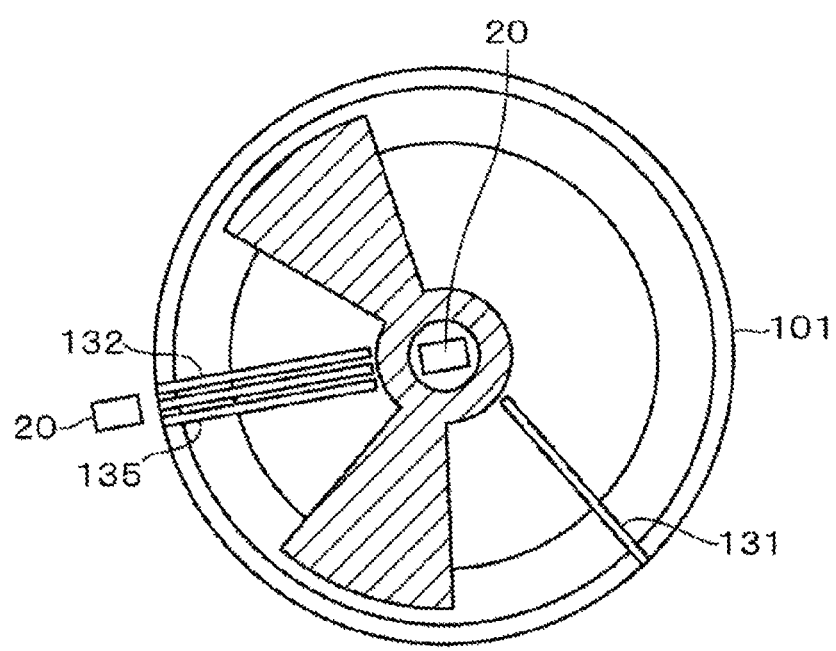
FIG. 45 is a plane view showing another example of the plasma processing apparatus of FIG. 40.

Next, description will be made on other examples of the semi-batch type plasma processing apparatus. FIG. 45 shows an example in which the magnetic field forming mechanisms 20 are disposed in the central region C and outside the vacuum vessel 101, instead of arranging the magnetic field forming mechanisms 20 at the front and back sides of the second process gas nozzle 132 in the rotational direction of the rotary table 102. At the outer side of the vacuum vessel 101, the second process gas nozzle 132 and the opposing electrodes 135 and 135 are bent so as to divert the magnetic field forming mechanisms 20 disposed outside the vacuum vessel 101.

Figure 46:
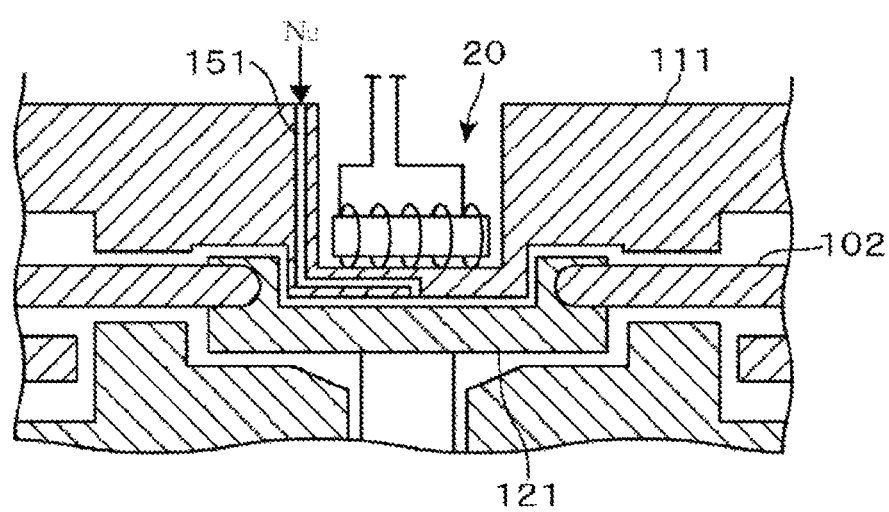
FIG. 46 is a vertical sectional view of the plasma processing apparatus of FIG. 40 according to the another example.

On the other hand, the central portion of an upper surface of the ceiling plate 111 of the vacuum vessel 101 is depressed into a substantially cylindrical shape as shown in FIG. 46. The magnetic field forming mechanism 20 is accommodated within the central region C as the depressed portion. This is, the central portion of a lower surface of the ceiling plate 111 protrudes downward. An upper end portion of the core member 121 installed in the central portion of the rotary table 102 is depressed such that it is not in contact with the protruded central portion of the ceiling plate 111. The isolating gas supply pipe 151 is installed around the magnetic field forming mechanism 20 disposed in the central portion such that it does not interfere with the central magnetic field forming mechanism 20. In this configuration, it is possible to obtain the same effects as mentioned above.

Figure 47:
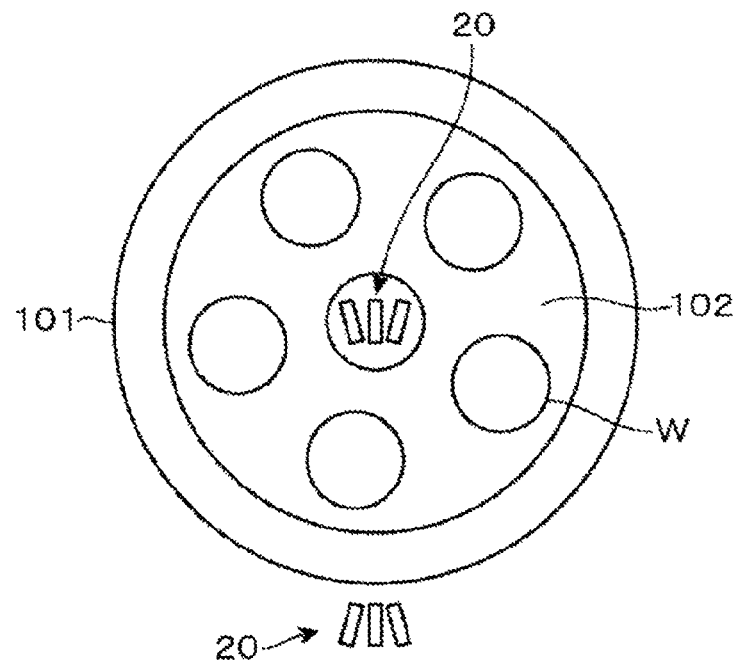
FIG. 47 is a plane view showing another example of the plasma processing apparatus of FIG. 40.
Figure 48:
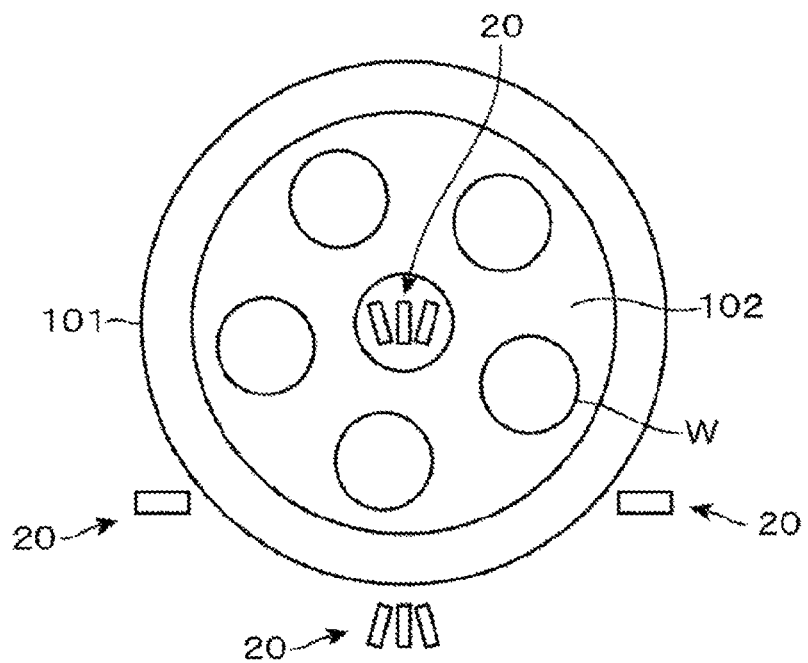
FIG. 48 is a plane view showing yet another example of the plasma processing apparatus of FIG. 40.
Figure 49:
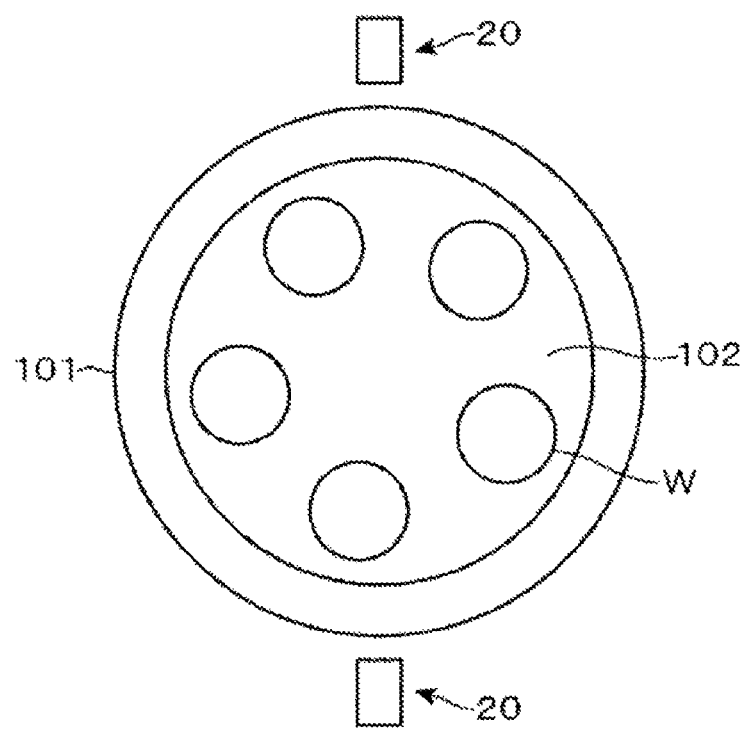
FIG. 49 is a plane view showing yet another example of the plasma processing apparatus of FIG. 40.

FIG. 47 shows an example in which three magnetic field forming mechanisms 20 are disposed outside the vacuum vessel 101 in a mutually adjacent relationship and in which three magnetic field forming mechanisms 20 are disposed in the central region C of the rotary table 102 so as to face the respective magnetic field forming mechanisms 20 existing outside the vacuum vessel 101. FIG. 48 shows an example in which, in addition to the magnetic field forming mechanisms 20 shown in FIG. 47, two magnetic field forming mechanisms 20 are disposed outside the vacuum vessel 101 so as to face each other across a region between the outer peripheral edge of the rotary table 102 and the central region C. FIG. 49 shows an example in which magnetic field forming mechanisms 20 are disposed at one and the other sides of a horizontal line extending through the rotation axis of the rotary table 102 so as to face each other across the central region C of the rotary table 102. In FIGS. 47 through 49, the respective nozzles are not shown and the parts such as the vacuum vessel 101 and so forth are schematically shown.

In the semi-batch type plasma processing apparatus described above, the magnetic flux lines formed within the vacuum vessel 101 may be switched using the electromagnets in the aforementioned manner or by rotating the magnet member 26 about the vertical axis through the use of the rotating shaft 27. Instead of using the electromagnets or the rotating shaft 27, the rotating shaft 122 for rotating the rotary table 102 may be used to switch the magnetic flux lines. In other words, when seen from one of the wafers W revolving together with the rotary table 102, even if the magnetic flux lines of the magnetic field forming mechanisms 20 are not switched, orientations of the magnetic flux lines passing through the surface of the wafer W in one position on the rotary table 102 differ from orientations of the magnetic flux lines passing through the surface of the wafer W in another position defined at the back side of said one position in the rotational direction of the rotary table 102. Therefore, instead of the switches 24 or together with the switches 24, a member (i.e., the rotating shaft 122) configured to change a posture of the wafer W may be used as a magnetic field switching mechanism for switching the magnetic fields of the magnetic field forming mechanisms 20.

In the respective examples of the semi-batch type plasma processing apparatus described above, a film formation cycle including the formation of the adsorption layer 51 and the formation of the reaction layer 52 is repeated a multiple number of times. In some embodiments, an operation of modifying the reaction layer 52 may be performed in each of the film formation cycles. More specifically, as already described in respect of the silicon oxide film forming process, the reaction layer 52 is made dense by the electrons. Therefore, in some embodiments, the operation of forming the reaction layer 52 and the operation of making the reaction layer 52 dense may be performed independently of each other. In other words, it can be said that, in the respective examples described above, the operation of forming the reaction layer 52 and the operation of making the reaction layer 52 dense are performed at the same time.

Figure 50:
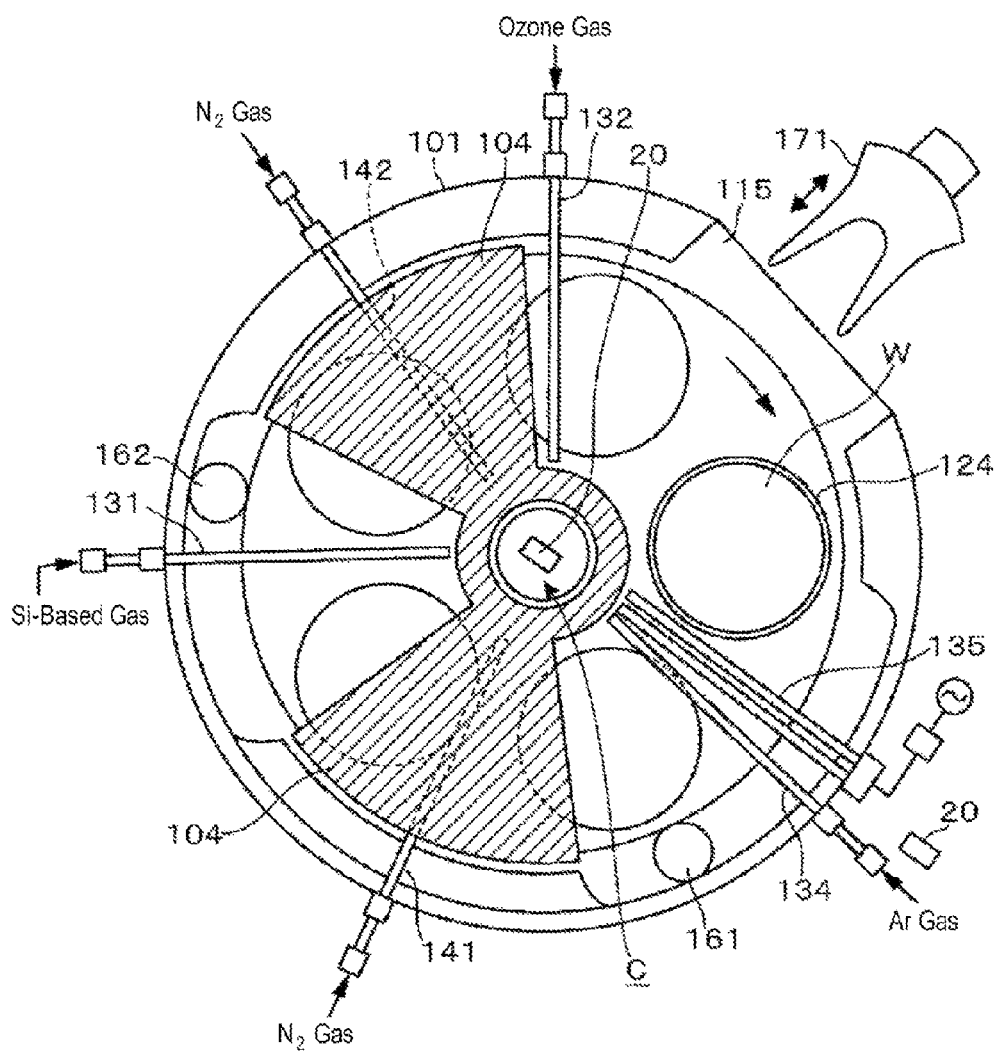
FIG. 50 is a plane view showing yet another example of the plasma processing apparatus of FIG. 40.

In a specific apparatus, as shown in FIG. 50, when seen from the transfer port 115, an auxiliary gas nozzle 134 for supplying a gas for plasma generation, e.g., an argon (Ar) gas, an isolating gas nozzle 141, a first reaction gas nozzle 131, an isolating gas nozzle 142 and a second process gas nozzle 132 are disposed clockwise in the named order. Opposing electrodes 135 and 135 are installed adjacent to the auxiliary gas nozzle 134 at the front side of the auxiliary gas nozzle 134 in the rotational direction of the rotary table 102. Magnetic field forming mechanisms 20 are disposed, e.g., in the central region C and outside the vacuum vessel 101 at the outer side of the opposing electrodes 135 and 135.

In this apparatus, an adsorption layer 51 is formed at a lower side of the first reaction gas nozzle 131. Thereafter, at a lower side of the second process gas nozzle 132, a reaction layer 52 is formed by, e.g., an ozone gas injected from the second process gas nozzle 132. At the lower side of the second process gas nozzle 132, electrons are not supplied to the inner wall surfaces of the recess 50. In addition, electrons are not supplied to the horizontal surface of the wafer W. Therefore, the densification of the reaction layer 52 does not proceed. Subsequently, if the wafer W reaches a position below the auxiliary gas nozzle 134, the electrons contained in plasma of the gas for plasma generation move in the horizontal direction. Thus, the densification of the reaction layer 52 proceeds on the exposed surface of the wafer W including the inner wall surfaces of the recess 50.

[Third Embodiment: Batch Type Plasma Processing Apparatus]

Figure 51:
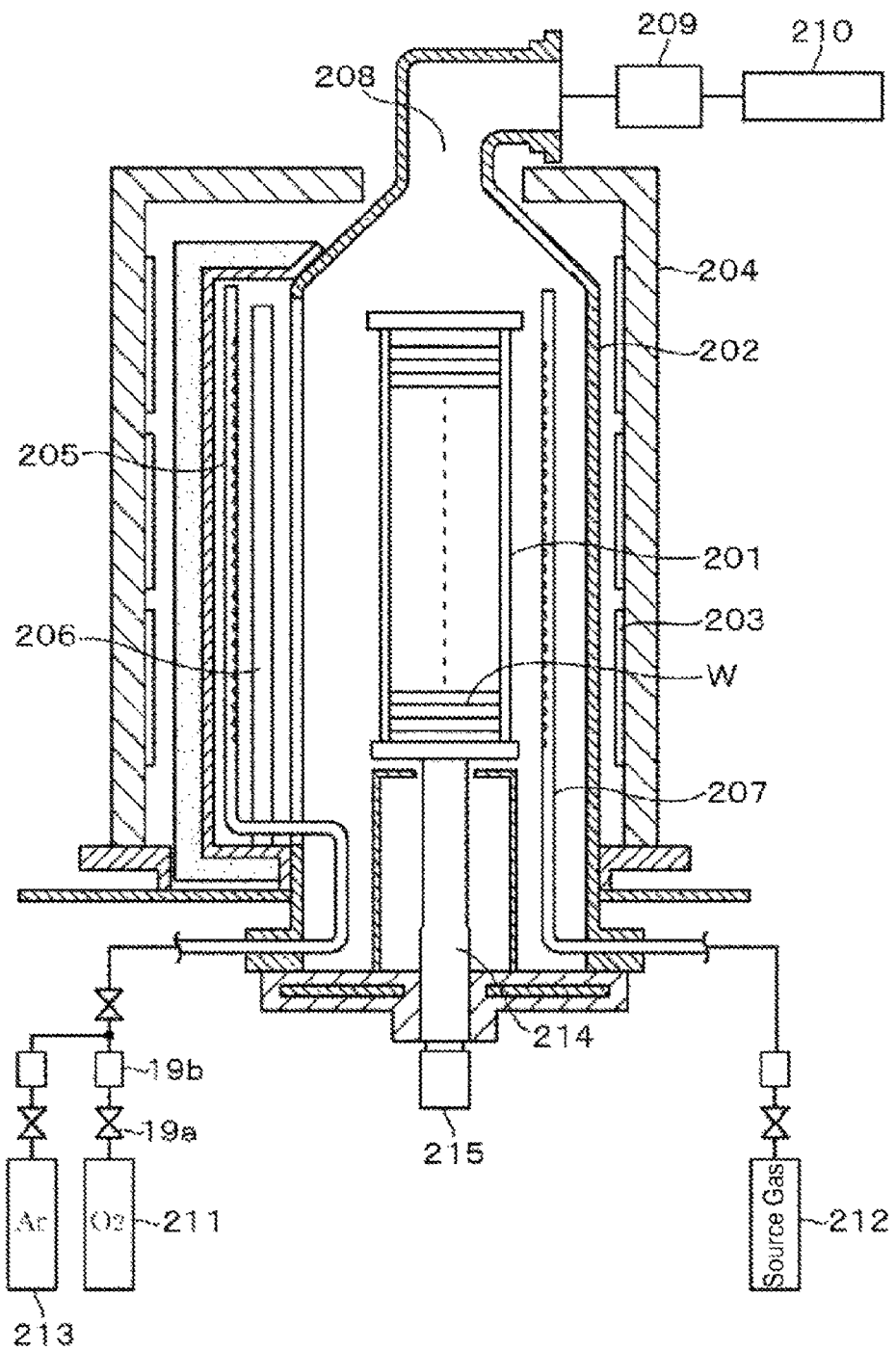
FIG. 51 is a vertical sectional view showing an example of a plasma processing apparatus according to a third embodiment of the present disclosure.
Figure 52:
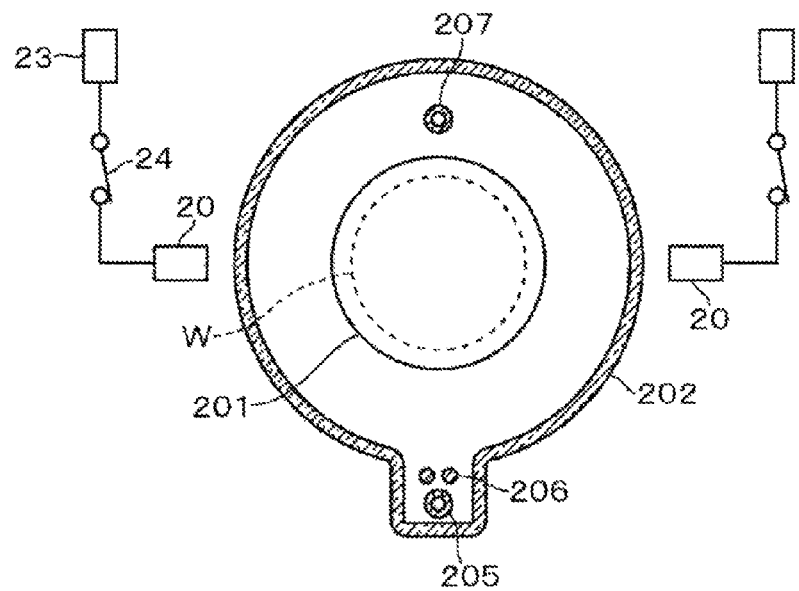
FIG. 52 is a traversal cross sectional view of the plasma processing apparatus of FIG. 51.

Next, a batch type plasma processing apparatus according to a third embodiment of the present disclosure, which simultaneously performs film formation processes with respect to a plurality of (e.g., 150) wafers W, will be described with reference to FIGS. 51 and 52. This apparatus includes a wafer boat 201 used as a table unit configured to receive wafers W thereon in a shelf pattern, and a reaction tube 202 used as a vertical processing vessel, which is configured to air-tightly accommodate the wafer boat 201 therein and perform a film formation process with respect to the wafers W. A heating furnace body 204 is installed outside the reaction tube 202. Heaters 203 used as heating units are disposed on inner wall surfaces of the heating furnace body 204 along a circumferential direction.

The reaction tube 202 has a bulged side portion that is bulged outward along a longitudinal direction. As shown in FIG. 52, a reaction gas injector 205 and a pair of electrodes 206 and 206, both of which extend in the vertical direction, are accommodated within the bulged side portion. A vertically-extending raw material gas injector 207 configured to supply a raw material gas is disposed within the reaction tube 202 so as to face the reaction gas injector 205 and the electrodes 206 and 206 across the wafer boat 201. An upper end portion of the reaction tube 202 makes up an exhaust port 208. The interior of the reaction tube 202 can be exhausted by a vacuum pump 210 used as an exhaust mechanism connected to the exhaust port 208 through a pressure control unit 209. In FIG. 51, reference numbers 211, 212 and 213 designate an oxygen gas reservoir, a raw material gas reservoir and an argon gas reservoir, respectively.

A rotating mechanism 215 such as a motor or the like is connected to a lower end of the wafer boat 201 through a rotating shaft 214 and is configured to rotate the wafer boat 201 about a vertical axis. As shown in FIG. 52, the magnetic field forming mechanisms 20 described above are disposed outside the reaction tube 202 so as to face each other. The magnetic field forming mechanisms 20 are disposed at a plurality of locations along a longitudinal direction of the wafer boat 201 and are configured to form horizontally-extending magnetic flux lines on surfaces of the respective wafers W.

In this apparatus, a plurality of wafers W is placed on the wafer boat 201. Then, the wafer boat 201 is air-tightly accommodated within the reaction tube 202. Subsequently, while keeping the interior of the reaction tube 202 at a predetermined film formation pressure, a raw material gas is supplied to the wafer boat 201 rotating about the vertical axis, thereby forming the adsorption layer 51 on the surface of each of the wafers W. Subsequently, an internal atmosphere of the reaction tube 202 is replaced and then the magnetic flux lines are formed within the reaction tube 202. If an oxygen gas plasma is supplied to the surfaces of the wafers W while switching the magnetic flux lines, the reaction layer 52 is formed as in the respective examples described above. More specifically, the plasma is supplied to the respective wafers W from a lateral side. As described earlier, the recess 50 having a large aspect ratio is formed on the surface of each of the wafers W. Therefore, if the magnetic flux lines are not formed within the reaction tube 202, the plasma (electrons and ions) is difficult to impinge against the inner wall surfaces of the recess 50. On the other hand, if the magnetic flux lines are formed within the reaction tube 202, the electrons and the ions move in the horizontal direction within the recess 50 over a depth direction of the recess 50. Therefore, a thin film having the same quality and thickness as those of the thin film formed on the horizontal surface of the wafer W is formed on the inner wall surfaces of the recess 50.

In this embodiment, the respective wafers W are rotated around the vertical axis. Therefore, the rotating mechanism 215 may be used as a magnetic field switching mechanism without having to switch the magnetic flux lines formed by the magnetic field forming mechanisms 20. In some embodiments, the raw material gas may be turned to plasma by additionally installing the electrodes 206 and 206. In the respective embodiments described above, an intensity of the magnetic fields formed within the processing vessel 1 (the vacuum vessel 101 or the reaction tube 202) is from 0.1 mT/cm to 1 T/cm. In the respective examples described above, the magnetic flux lines formed within the processing vessel 1 (the vacuum vessel 101 or the reaction tube 202) are switched during the plasma processing. When the magnetic fields are so weak as to fall within a range of about 0.25 mT/cm to about 0.75 mT/cm, electrons and ions meander. Accordingly, in case where the weak magnetic fields are formed within the processing vessel 1, it is possible to obtain the same effects as available in the respective embodiments described above, even if the magnetic flux lines are not switched.

<Example>

Description will now be on test results obtained when a silicon oxide film (ULT-$SiO_2$ film: Ultra Low Temperature-$SiO_2$ film) is formed under weak magnetic fields without switching the magnetic fields formed within the processing vessel 1. In this test, wet etching rates with respect to hydrofluoric acid were measured in a case where a film formation process is performed without generating any magnetic field and in a case where the film formation process is performed while generating weak magnetic fields. Specific film formation conditions are set as follows. The single substrate processing apparatus described above with reference to FIG. 1 was used as a film formation apparatus. The film formation process was performed by an ALD method.

Figure 53:
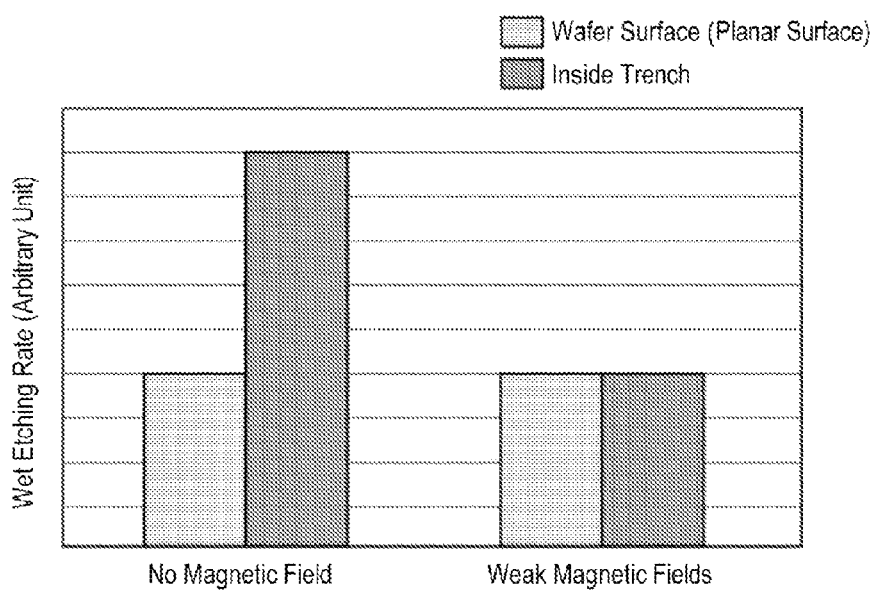
FIG. 53 is a characteristic diagram representing test results obtained in the examples of one or more embodiments of the present disclosure.

(Film Formation Conditions)
Film formation temperature: room temperature
Processing pressure: 66.66 Pa (0.5 Torr)
Raw material gas: bis(diethylamino)silane gas
Reaction gas: $O_2$ supplied at a flow rate of 1000 sccm
Other gases: Ar supplied at a flow rate of 500 sccm
Magnetic field intensity: 0.26 mT/cm (measured at the center of a wafer)
Number of ALD processing cycles: 120 cycles
High-frequency power for plasma generation: 1000 W
Frequency of high-frequency power for plasma generation: 13.56 MHz Consequently, as represented in FIG. 53, if the film formation process is performed without generating any magnetic field, the film formed within a trench (groove) is more soluble to the hydrofluoric acid than the film formed on the surface (planar surface) of the wafer W. It can be noted the density of the film is not so high within the trench. On the other hand, if the film formation process is performed while forming the weak magnetic fields, the film formed on the surface of the wafer W and the film formed within the trench have the same level of solubility to hydrofluoric acid. It can be appreciated that the film formed within the trench shows a good density. The test results reveal that, under the weak magnetic fields, the effects of the present disclosure can be obtained even if the film formation process is performed without switching the magnetic flux lines formed within the processing vessel 1.

In the present disclosure, when processing the substrate through the use of the plasma obtained by turning the process gas to plasma, the magnetic fields for horizontally moving electrons along the surface of the substrate are formed within the processing vessel. The magnetic fields are formed such that the magnetic fields are opened at at-least one point in the peripheral edge portion of the substrate so as not to completely surround the peripheral edge portion of the substrate when viewed from the top. For that reason, the plasma density is not increased even if a recess is formed on the surface of the substrate. Therefore, while suppressing occurrence of damage in the substrate, electrons and ions can be caused to impinge against the inner wall surfaces of the recess as well as the surface of the substrate and the bottom surface of the recess. This makes it possible to satisfactorily perform the plasma processing. Accordingly, if the plasma processing is a film formation process that makes use of a process gas, a thin film having a uniform thickness and quality can be formed on the exposed surface of the substrate including the inner wall surfaces of the recess.

While certain embodiments have been described, these embodiments have been presented by way of example only, and are not intended to limit the scope of the disclosures. Indeed, the novel apparatus and methods described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus, comprising:
a table unit installed within a processing vessel and configured to receive a substrate thereon, wherein the table unit is configured as a lower electrode;
a gas supply unit configured to supply a process gas into the processing vessel, wherein the gas supply unit is disposed to face the table unit and configured as an upper electrode;
a plasma generating unit configured to turn the process gas to plasma and supply high-frequency power to at least one of the lower electrode and the upper electrode;
at least one magnetic field forming mechanism installed at at least one location on a lateral side of the table unit and configured to form magnetic fields in a processing atmosphere in order to move electrons existing in the plasma of the process gas along a surface of the substrate;
an exhaust mechanism configured to exhaust gas from the interior of the processing vessel;
connection paths configured to electrically interconnect between the gas supply unit as the upper electrode and the table unit as the lower electrode;
a high-frequency switching mechanism configured to switch the connection paths such that, when the high-frequency power is supplied from the plasma generating unit to the upper electrode, the connection path between the plasma generating unit and the lower electrode is cut off, and when the high-frequency power is supplied to the lower electrode, the connection path between the plasma generating unit and the upper electrode is cut off; and
a control unit configured to output a control signal such that, when the electrode to be supplied with the high-frequency power is switched by the high-frequency switching mechanism, the generation of the high-frequency power is stopped so as to prevent the lower electrode and upper electrode from being short-circuited,
wherein the magnetic fields are opened at at-least one point in a peripheral edge portion of the substrate such that a loop of magnetic flux lines surrounding the peripheral edge portion of the substrate is not formed.

2. The apparatus of claim 1, further comprising:
at least one magnetic field switching mechanism configured to switch a movement direction of the electrons between different directions extending along the surface of the substrate; and
a control unit configured to output a control signal so as to enable the at least one magnetic field switching mechanism to switch the magnetic flux lines in the processing atmosphere during the plasma processing.

3. The apparatus of claim 1, wherein a plasma density available when the magnetic fields are formed is less than 1.10 times a plasma density available when the magnetic fields are not formed.

4. The apparatus of claim 1, wherein the gas supply unit includes a raw material gas supply path configured to supply a raw material gas-containing silicon, and a reaction gas supply path configured to supply a reaction gas reacting with the raw material gas.

5. The apparatus of claim 1, wherein the gas supply unit includes a raw material gas supply path configured to supply a raw material gas-containing silicon, a reaction gas supply path configured to supply a reaction gas, and a control unit configured to output a control signal so as to alternately supply the raw material gas and the reaction gas into the processing vessel.

6. The apparatus of claim 2, wherein the at least one magnetic field forming mechanism is disposed at the at least one location along a circumferential direction of the processing vessel, and the control unit is further configured to output a control signal so as to enable the at least one magnetic field switching mechanism to switch the at least one magnetic field forming mechanism.

* * * * *